(12) United States Patent
Fukasawa et al.

(10) Patent No.: US 10,361,344 B2
(45) Date of Patent: Jul. 23, 2019

(54) LIGHT EMITTING DEVICE

(71) Applicants: CITIZEN ELECTRONICS CO., LTD., Fujiyoshida-shi, Yamanashi (JP); CITIZEN WATCH CO., LTD., Tokyo (JP)

(72) Inventors: Koichi Fukasawa, Kofu (JP); Nodoka Oyamada, Fujiyoshida (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/534,297

(22) PCT Filed: Dec. 10, 2015

(86) PCT No.: PCT/JP2015/084708
§ 371 (c)(1),
(2) Date: Jun. 8, 2017

(87) PCT Pub. No.: WO2016/093325
PCT Pub. Date: Jun. 16, 2016

(65) Prior Publication Data
US 2017/0365754 A1 Dec. 21, 2017

(30) Foreign Application Priority Data

Jun. 2, 2015 (JP) .................................. 2015-112330
Dec. 10, 2015 (JP) .................................. 2014-250850

(51) Int. Cl.
*H01L 33/50* (2010.01)
*H01L 33/64* (2010.01)
(Continued)

(52) U.S. Cl.
CPC .............. *H01L 33/507* (2013.01); *F21K 9/00* (2013.01); *F21S 2/00* (2013.01); *F21V 19/00* (2013.01);
(Continued)

(58) Field of Classification Search
CPC ....... H01L 33/507; H01L 33/56; H01L 33/62; H01L 33/644; H01L 25/0753;
(Continued)

(56) References Cited

U.S. PATENT DOCUMENTS 9,310,062 B2   4/2016 Tsuchiya et al.
2006/0012299 A1* 1/2006 Suehiro .................. H01L 33/20
                                                        313/512
(Continued)

FOREIGN PATENT DOCUMENTS

CN   1770488 A    5/2006
CN   103594611 A  2/2014
(Continued)

OTHER PUBLICATIONS

Written Opinion of the International Searching Authority for International Application No. PCT/JP2015/084708, dated Feb. 9, 2016, 6 pages.

(Continued)

Primary Examiner — Natalia A Gondarenko
(74) Attorney, Agent, or Firm — RatnerPrestia

(57) ABSTRACT

A light-emitting device in which the emission intensity of light-emitting elements is improved by making heat generated by light emission of the light-emitting elements be effectively released is provided. The light-emitting device includes a mounting substrate including a mounting region, light-emitting elements mounted on the mounting region, a sealing resin which contains a phosphor and integrally seals the light-emitting elements, and at least one heat transfer (Continued)

member which is arranged among the light-emitting elements on the mounting region, is embedded in the sealing resin, and has a higher thermal conductivity than the sealing resin.

9 Claims, 22 Drawing Sheets

(51) Int. Cl.
  H01L 33/62 (2010.01)
  H01L 33/56 (2010.01)
  H01L 25/075 (2006.01)
  F21V 31/00 (2006.01)
  F21V 31/04 (2006.01)
  F21K 9/00 (2016.01)
  F21S 2/00 (2016.01)
  F21V 19/00 (2006.01)
  F21V 23/00 (2015.01)
  H01L 33/48 (2010.01)

(52) U.S. Cl.
  CPC ............ F21V 23/00 (2013.01); F21V 31/00 (2013.01); F21V 31/04 (2013.01); H01L 25/0753 (2013.01); H01L 33/48 (2013.01); H01L 33/56 (2013.01); H01L 33/62 (2013.01); H01L 33/644 (2013.01); H01L 2224/48091 (2013.01); H01L 2224/48137 (2013.01); H01L 2224/48139 (2013.01); H01L 2924/181 (2013.01)

(58) Field of Classification Search
  CPC ..... H01L 33/64; H01L 33/641; H01L 33/642; H01L 25/042; H01L 25/0655; H01L 25/072; H01L 25/167; H01L 25/165; H01L 2924/12041; H01L 2924/163; H01L 2924/1631; H01L 2924/16315; H01L 2924/351; H01L 2933/0058; H01L 2933/0075; H01L 2933/05; H01L 33/00; H01L 33/04; H01L 2924/0002; H01L 2924/181; H01L 2224/48091; H01L 2224/48137; H01L 2224/48139; H05K 2201/10242; H05K 2201/10106; H05K 2201/09481; F21V 31/00; F21V 31/04; F21V 23/00; F21V 19/00
  USPC ............ 257/98, 99, 88, 91, 89, 100; 438/28; 362/615, 606, 621, 612
  See application file for complete search history.

(56) References Cited

U.S. PATENT DOCUMENTS

| 2006/0034084 A1* | 2/2006 | Matsuura ............ H01L 33/507 362/293 |
| 2006/0065906 A1 | 3/2006 | Harada |
| 2006/0102917 A1* | 5/2006 | Oyama ................ H01L 33/60 257/99 |
| 2009/0166657 A1 | 7/2009 | Yamada et al. |
| 2010/0117100 A1* | 5/2010 | Ogawa ................ F21V 21/30 257/88 |
| 2010/0142182 A1* | 6/2010 | Van Woudenberg ........................ G02F 1/133603 362/84 |
| 2013/0087817 A1* | 4/2013 | An .................... H01L 33/486 257/89 |
| 2013/0107525 A1* | 5/2013 | Woodgate ............ F21K 9/00 362/237 |
| 2013/0328088 A1* | 12/2013 | Morikawa ........... H01L 33/44 257/98 |
| 2014/0098538 A1* | 4/2014 | De Vaal .............. F21V 29/02 362/249.02 |
| 2014/0119024 A1* | 5/2014 | Yu .................... F21S 6/00 362/294 |
| 2015/0001559 A1* | 1/2015 | Sasaoka ............ H01L 25/0753 257/88 |

FOREIGN PATENT DOCUMENTS

| JP | 2009010308 A | 1/2009 |
| JP | 2009164157 A | 7/2009 |
| JP | 2011233635 A | 11/2011 |
| JP | 2012009633 A | 1/2012 |
| JP | 2012044048 A | 3/2012 |
| JP | 2013021042 A | 1/2013 |
| JP | 2014041993 A | 3/2014 |

OTHER PUBLICATIONS

International Search Report and Written Opinion for International Application No. PCT/JP2015/084708, dated Feb. 9, 2016—7 Pages.
Chinese Office Action for Chinese Application No. 201580065048.3, dated Oct. 8, 2018 with translation, 9 pages.
Chinese Office Action for Chinese Application No. 201580065048.3, dated Mar. 25, 2019, with translation, 21 pages.

* cited by examiner

LIGHT EMITTING DEVICE

CROSS REFERENCE TO RELATED APPLICATIONS

This is the U.S. National Phase application of PCT/JP2015/084708, filed Dec. 10, 2015, which claims priority to Japanese Patent Application Nos. 2014-250850, filed Dec. 11, 2014, and 2015-112330, filed Jun. 2, 2015, the disclosures of each of these applications being incorporated herein by reference in their entireties for all purposes.

TECHNICAL FIELD

The present invention relates to a light-emitting device.

BACKGROUND ART

A COB (Chip On Board) light-emitting device in which light-emitting elements, such as LED (light-emitting diode) elements, are mounted on a general-purpose substrate, such as a ceramic substrate or a metal substrate, is known. In such a light-emitting device, white light or the like is obtained depending on the intended use by sealing, for example, LED elements that emit blue light with a resin containing a phosphor, and mixing light obtained by exciting the phosphor with the light from the LED elements.

As light-emitting elements of a light-emitting device used for a general lighting purpose, blue LEDs that emit blue light, UV elements, or the like are suitable because it is easy to produce a white emission color. In addition, as a resin material for sealing such light-emitting elements, a silicone is often used by due to an emission color of light-emitting elements to be used.

As light sources for lighting to replace light bulbs and fluorescent lamps, a lighting device using light-emitting elements (LED elements) is adopted recently. LED elements consume lower amount of power compared to light bulbs and the like, but have low directivity because of being point light sources, and thus, in an LED lighting device, about several tens to several hundred LED elements are mounted, and these elements are sealed with a translucent resin, so that a light-emitting surface having uniform brightness is formed. For example, in Patent Literature 1 and 2, a light-emitting device having a light-emitting surface formed by sealing light-emitting elements mounted on a substrate with a translucent resin material is described.

In addition, Patent Literature 3 describes a light-emitting device in which light-emitting elements mounted on a base material having, on a surface thereof, a conductor layer connected to the outside are sealed. The light-emitting device includes a phosphor layer arranged above the light-emitting elements and a resin layer which is in contact with both the phosphor layer and the conductor layer and has dispersed heat transfer particles to improve heat generation from phosphor particles.

In addition, a manufacturing method of such a light-emitting device is known in which a phosphor dispersed in a resin is made to be precipitated, and then, the resin is hardened, in order to suppress variation in chromaticity, for example. For example, Patent Literature 4 describes a manufacturing method of a light-emitting element package including the steps of forming a repellent agent pattern on a substrate, mounting LED chips on the inside of the repellent agent pattern on the substrate, applying a sealing resin in which a phosphor is kneaded on the inside of the repellent agent pattern, and making the phosphor in the sealing resin be precipitated in a windless state.

CITATIONS LIST

Patent Literature

Patent literature 1: Japanese Unexamined Patent Publication (Kokai) No. 2013-021042
Patent literature 2: Japanese Unexamined Patent Publication (Kokai) No. 2009-164157
Patent literature 3: Japanese Unexamined Patent Publication (Kokai) No. 2014-041993
Patent literature 4: Japanese Unexamined Patent Publication (Kokai) No. 2012-044048

SUMMARY OF INVENTION

In a light-emitting device in which light-emitting elements are sealed with a sealing resin in which a phosphor is dispersed, the phosphor generates heat by light from the light-emitting elements, and the emission intensity of the light-emitting elements is decreased by the heat. Even when a metal substrate which excels in heat dissipation is used as a mounting substrate of the light-emitting elements, the heat by the phosphor at a position away from the mounting substrate is not sufficiently transferred to the mounting substrate, and thus, the heat is easy to be accumulated in the sealing resin, and it is still difficult to prevent a decrease in the emission intensity.

It is an object of the present invention to provide a light-emitting device in which the emission intensity of light-emitting elements is improved by making heat generated by light emission of the light-emitting elements be effectively released.

Provided is a light-emitting device including a mounting substrate including a mounting region, light-emitting elements mounted on the mounting region, a sealing resin which contains a phosphor and integrally seals the light-emitting elements, and at least one heat transfer member which is arranged among the light-emitting elements on the mounting region, is embedded in the sealing resin, and has a higher thermal conductivity than the sealing resin.

Preferably, in the above light-emitting device, the light-emitting elements are arranged in a lattice pattern on the mounting region, and the at least one heat transfer member includes a plurality of heat transfer members which are columnar members respectively arranged in lattices configured by the light-emitting elements. Further, it is preferable that a lower end of the heat transfer member be embedded in the mounting substrate.

Preferably, the above light-emitting device further includes wires for electrically connecting the light-emitting elements to one another in the sealing resin, wherein the heat transfer member is made of a material harder than the sealing resin, and includes an upper end located at a position higher than upper ends of the wires.

Preferably, in the above light-emitting device, the light-emitting elements are mounted on the mounting region through bumps, respectively, and the heat transfer member is made of a material harder than the sealing resin, and includes an upper end located at a position higher than an upper surface of any of the light-emitting elements.

Preferably, in the above light-emitting device, the heat transfer member is made of a metal material, or alternatively, the heat transfer member is made of a material having translucency or light diffusivity, and contains a phosphor.

Preferably, in the above light-emitting device, the heat transfer member includes a fence-like circumferential surface surrounding a periphery of the light-emitting elements.

Preferably, in the above light-emitting device, a reflecting surface is provided on the circumferential surface of the heat transfer member.

Preferably, the above light-emitting device further includes wires for electrically connecting the light-emitting elements to one another in the sealing resin, wherein the heat transfer member is made of a material harder than the sealing resin, and includes an upper end located at a position higher than upper ends of the wires, and a notch for passing the wires is partially provided on the upper end of the heat transfer member.

Preferably, in the above light-emitting device, the sealing resin includes a first layer and a second layer in which a concentration of the phosphor is different from each other, in this order from a side near the mounting substrate, and the concentration of the phosphor in the first layer is higher than the concentration of the phosphor in the second layer.

In addition, provided is a light-emitting device including a substrate having a frame provided on an outer edge thereof, light-emitting elements arranged on the substrate, a sealing resin filled in the frame to seal the light-emitting elements, wherein the substrate is provided with a deformation preventing member preventing the sealing resin from being dented to a certain depth or more when the sealing resin is dented due to pressure from above.

Preferably, in the above light-emitting device, the light-emitting elements are electrically connected with wires, and the deformation preventing member is formed so as to have a enough height for a dent in the sealing resin not to reach the wires when the light-emitting elements are sealed by the sealing resin.

Preferably, in the above light-emitting device, the light-emitting elements are mounted on the substrate through bumps, and the deformation preventing member is formed so as to have a enough height for a dent in the sealing resin not to reach the light-emitting elements when the light-emitting elements are sealed by the sealing resin.

Preferably, in the above light-emitting device, the deformation preventing member is formed by a material harder than the sealing resin.

Preferably, in the above light-emitting device, the deformation preventing member is formed by resin or glass which has translucency or light diffusivity, has hardness and contains a certain amount of a fluorescent agent.

Preferably, in the above light-emitting device, the sealing resin is made of a silicone resin, and the deformation preventing member is made of a silicone resin or an epoxy resin harder than the sealing resin.

Preferably, in the above light-emitting device, the deformation preventing member is formed by a metal material.

Preferably, in the above light-emitting device, the deformation preventing member is provided around the light-emitting elements arranged on the substrate.

Preferably, in the above light-emitting device, the deformation preventing member is provided at four spots in diagonal directions of lattices configured by the light-emitting elements arranged on the substrate.

According to the above light-emitting device, it is possible to make heat generated by light emission of light-emitting elements be effectively released, and thereby improve the emission intensity of the light-emitting elements.

DESCRIPTION OF EMBODIMENTS

Hereinafter, with reference to the accompanying drawings, a light-emitting device will be explained in detail. However, it should be noted that the present invention is not limited to the drawings or the embodiments described below.

Figure 1A:
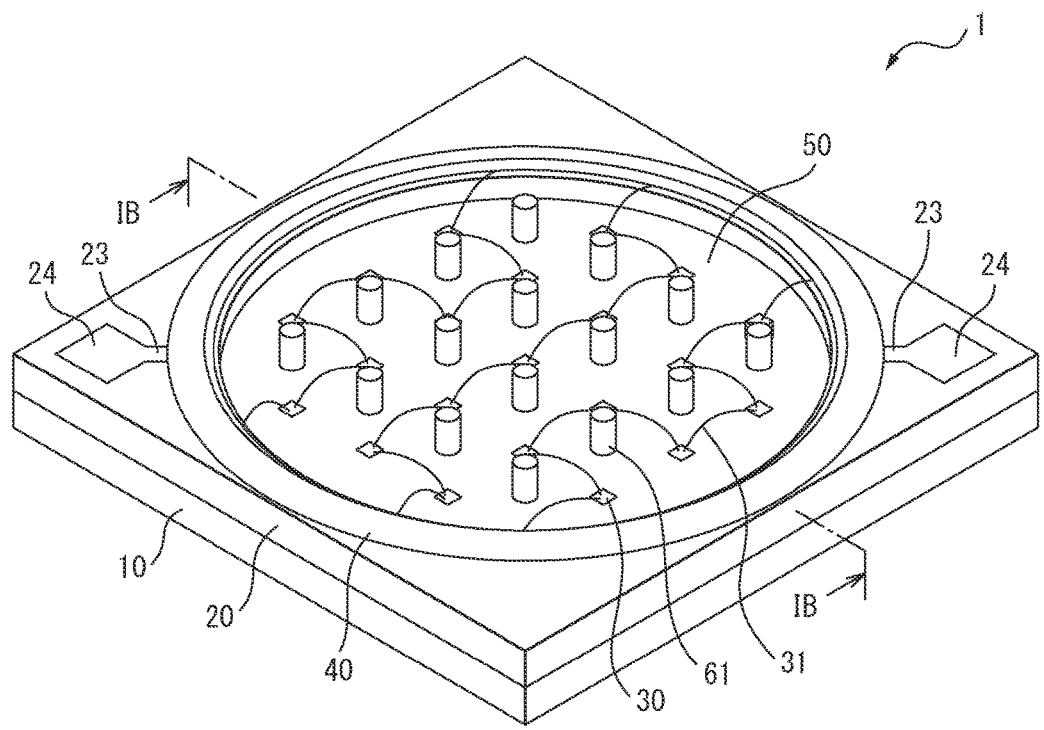
FIG. 1A is a perspective view of a light-emitting device 1.
Figure 1B:
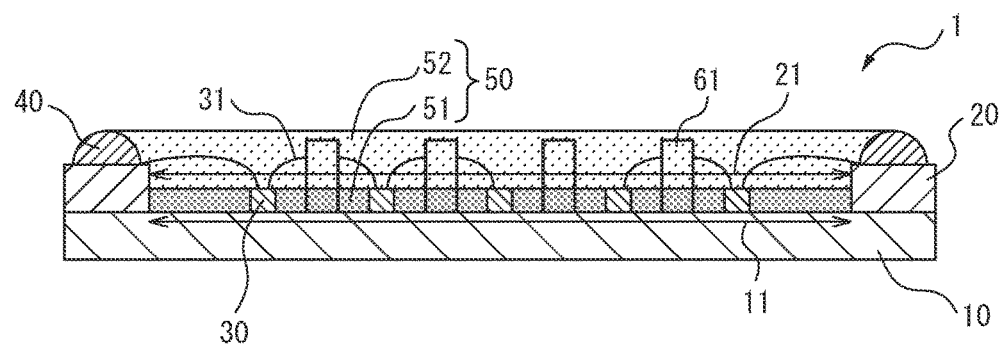
FIG. 1B is a cross-sectional view of the light-emitting device 1.

FIG. 1A is a perspective view of a light-emitting device 1 as a finished product, and FIG. 1B is a cross-sectional view of the light-emitting device 1 taken along the line IB-IB of FIG. 1A. The light-emitting device 1 includes LED elements as light-emitting elements, and is used as various lighting devices, such as LEDs for lighting and LED light bulbs. The light-emitting device 1 includes, as main components, a mounting substrate 10, a circuit substrate 20, LED elements 30, a resin frame 40, a sealing resin 50, and heat transfer members 61.

The mounting substrate 10 is a metal substrate which has a square shape, as an example, and has, at the center on the upper surface thereof, a circular mounting region 11 on which the LED elements 30 are mounted. The mounting substrate 10 also functions as a heat dissipating substrate that dissipates heat generated by the LED elements 30 and phosphor particles described below, and thus, for example, is made of aluminum which excels in heat resistance and heat dissipation. However, the material of the mounting substrate 10 may be another metal such as, copper, as long as it excels in heat resistance and heat dissipation.

The circuit substrate 20 has a square shape having the same size as that of the mounting substrate 10, as an example, and has a circular opening 21 at the center part thereof. The circuit substrate 20 is fixed by the lower surface thereof being attached to the mounting substrate 10 with an adhesive sheet, for example. On the upper surface of the circuit substrate 20, conductive patterns 23 (refer to FIG. 2A described below) of the LED elements 30 are formed so as to surround the opening 21. In addition, at two corner parts located at diagonal positions on the upper surface of the circuit substrate 20, connection electrodes 24 for connecting the light-emitting device 1 to an external power source are formed. One of the connection electrodes 24 is an anode electrode, and the other is a cathode electrode. They are connected to the external power source, and a voltage is applied thereto, whereby the light-emitting device 1 emits light.

The LED elements 30 are an example of light-emitting elements, and are blue LEDs that emit blue light having an emission wavelength band of about 450 to 460 nm, for example. In the light-emitting device 1, the LED elements 30 are arranged in a lattice pattern and mounted on the mounting region 11 of the mounting substrate 10, which is exposed from the opening 21 of the circuit substrate 20. In FIG. 1A, in particular, an example where 16 LED elements 30 are mounted is illustrated. The lower surfaces of the LED elements 30 are fixed to the upper surface of the mounting substrate 10 with a transparent insulating adhesive agent, for example. In addition, each of the LED elements 30 has a pair of element electrodes on the upper surface, and the element electrodes of adjacent LED elements 30 are electrically connected to one another by bonding wires (hereinafter, simply referred to as wires) 31, as illustrated in FIG. 1B. The wires 31 from the LED elements 30 located on the outer side of the opening 21 are connected to the conductive patterns 23 of the circuit substrate 20. Accordingly, a current is supplied to the respective LED elements 30 through the wires 31.

The resin frame 40 is a circular frame made of a white resin, for example, according to the size of the opening of the circuit substrate 20, and is fixed to a position overlapping with the conductive patterns 23 formed so as to frame the opening 21, on the upper surface of the circuit substrate 20. The resin frame 40 is a dam material for preventing flow of the sealing resin 50, and reflects light emitted laterally from the LED elements 30 toward the upper side of the light-emitting device 1 (the opposite side of the mounting substrate 10 as viewed from the LED elements 30).

The sealing resin 50 is injected into the opening 21, and integrally covers and protects (seals) the LED elements 30, the wires 31, and the heat transfer members 61 described below. For example, as the sealing resin 50, a colorless and transparent resin, such as an epoxy resin or a silicone resin, and, in particular, a resin having heat resistance of about 250° C. may be used. The sealing resin 50 is hardened into a circular shape in the example illustrated in FIG. 1A, and is fixed on the mounting substrate 10 by the resin frame 40, for example.

In addition, for example, a yellow phosphor, such as YAG (yttrium aluminum garnet), is dispersedly mixed in the sealing resin 50. The light-emitting device 1 emits white light obtained by mixing blue light from the LED elements 30 that are blue LEDs, and yellow light obtained by exciting the yellow phosphor thereby.

Alternatively, more than one type of phosphors, such as a green phosphor and a red phosphor, may be dispersedly mixed in the sealing resin 50. In this case, the light-emitting device 1 emits white light obtained by mixing the blue light from the LED elements 30 that are blue LEDs, and green light and red light obtained by exciting the green phosphor and the red phosphor thereby. The green phosphor is a particulate phosphor material that absorbs the blue light emitted from the LED elements 30 and converts the wavelength thereof into that of green light, such as $(BaSr)_2SiO_4$:$Eu^{2+}$. The red phosphor is a particulate phosphor material that absorbs the blue light emitted from the LED elements 30 and converts the wavelength thereof into that of red light, such as $CaAlSiN_3$:$Eu^{2+}$. In the sealing resin 50, for example, the yellow phosphor may be further mixed in addition to the green phosphor and the red phosphor, or a combination of phosphors, such as the yellow phosphor and the red phosphor, which is different from the above may be mixed.

In the light-emitting device 1, as an example, the sealing resin 50 is hardened in a state where phosphor particles therein are precipitated in layers. In the example illustrated in FIG. 1B, the sealing resin 50 includes a first layer 51 and a second layer 52 in which the concentrations of the phosphor are different from each other, in this order from the side near the mounting substrate 10, and the concentration of the phosphor in the first layer 51 is higher than the concentration of the phosphor in the second layer 52. The thickness of the first layer 51 is approximately the same as the height of the LED elements 30. The first layer 51 may be composed of more than one layer divided according to the types of the phosphors, for example, a layer having a high concentration of the green phosphor and a layer having a high concentration of the red phosphor. Alternatively, the sealing resin 50 may have a concentration gradient in which the concentration of the phosphor is gradually increased as approaching the side of the mounting substrate 10 without having layers in which the concentrations of the phosphor are distinctly different.

Since the phosphor is arranged near the mounting substrate 10 having a high heat dissipation property by precipitating the phosphor particles in layers in this manner, when the phosphor generates heat by light from the LED elements 30, the heat is easy to be released to the outside of the light-emitting device 1 through the mounting substrate 10. Therefore, a decrease in the emission intensity of the LED elements 30 due to heat can be prevented, and advantages for improving the emission intensity are obtained.

As described above, the heat dissipation of the light-emitting device is improved by precipitating the phosphor particles in layers, but, when the phosphor is uniformly dispersed in the sealing resin 50, the luminous efficiency by the phosphor becomes high, and accordingly brighter emission light is obtained. Thus, the phosphor may be uniformly dispersed in the entire sealing resin 50 unlike the mode illustrated in FIG. 1B.

The heat transfer members 61 are columnar members made of metal (conductive member) which has a higher thermal conductivity and a more excellent heat dissipation property than the sealing resin 50, such as aluminum, similarly to the mounting substrate 10. The heat transfer members 61 are arranged among the LED elements 30 in the mounting region 11, and are embedded in the sealing resin 50. In FIG. 1A, in particular, an example where 16 heat transfer members 61 are mounted is illustrated. As illustrated in FIG. 1A, each of the heat transfer members 61 is arranged at the center (intersection point of diagonals) of a rectangle (lattice) formed by four adjacent LED elements 30. In addition, as illustrated in FIG. 1B, the lower ends of the heat transfer members 61 are bonded to the upper surface of the mounting substrate 10, and the positions of the upper ends of the heat transfer members 61 are higher than positions where the wires 31 are provided.

In the light-emitting device 1, through the columnar heat transfer members 61 having a high heat dissipation property, which are arranged on the mounting substrate 10, heat from the phosphor in the sealing resin 50 can be effectively released to the mounting substrate 10, and thus, the heat dissipation property is improved. In particular, by the presence of the heat transfer members 61, even when the phosphor particles are not precipitated in layers but are uniformly dispersed in the sealing resin 50, heat accumulated in the sealing resin 50 can be effectively released to the mounting substrate 10. In addition, in the light-emitting device 1, each of the heat transfer members 61 is arranged at the center of a rectangle formed by four adjacent LED elements 30, and thus, the heat dissipation effect can be equally obtained in heat generation from any LED element 30.

In addition, a heat-resistant silicone resin used as the sealing resin 50 is so soft as to be easy to be deformed when pressing force is applied, and thus, the wires 31 may be cut when the sealing resin 50 is deformed by external force. However, in the light-emitting device 1, the heat transfer members 61 which are made of metal, have hardness, and have the upper ends located higher than the positions of the wires 31 are uniformly arranged in the sealing resin 50, and thus, the deformation of the sealing resin 50 due to external force can be prevented by the heat transfer members 61. In other words, the heat transfer members 61 also function as deformation preventing members. Thus, in the light-emitting device 1, even when a resin which has heat resistance but has low hardness is used as the sealing resin 50, the wires 31 are protected by the heat transfer members 61, and cutting thereof can be prevented from occurring.

FIG. 2A to FIG. 7B are perspective views and cross-sectional views illustrating a manufacturing process of the light-emitting device 1. FIG. 2B, FIG. 3B, FIG. 4B, FIG. 5B, FIG. 6B, and FIG. 7B respectively illustrate cross-sections taken along the line IIB-IIB of FIG. 2A, the line IIIB-IIIB of FIG. 3A, the line IVB-IVB of FIG. 4A, the line VB-VB of FIG. 5A, the line VIB-VIB of FIG. 6A, and the line VIIB-VIIB of FIG. 7A.

Figure 2A:
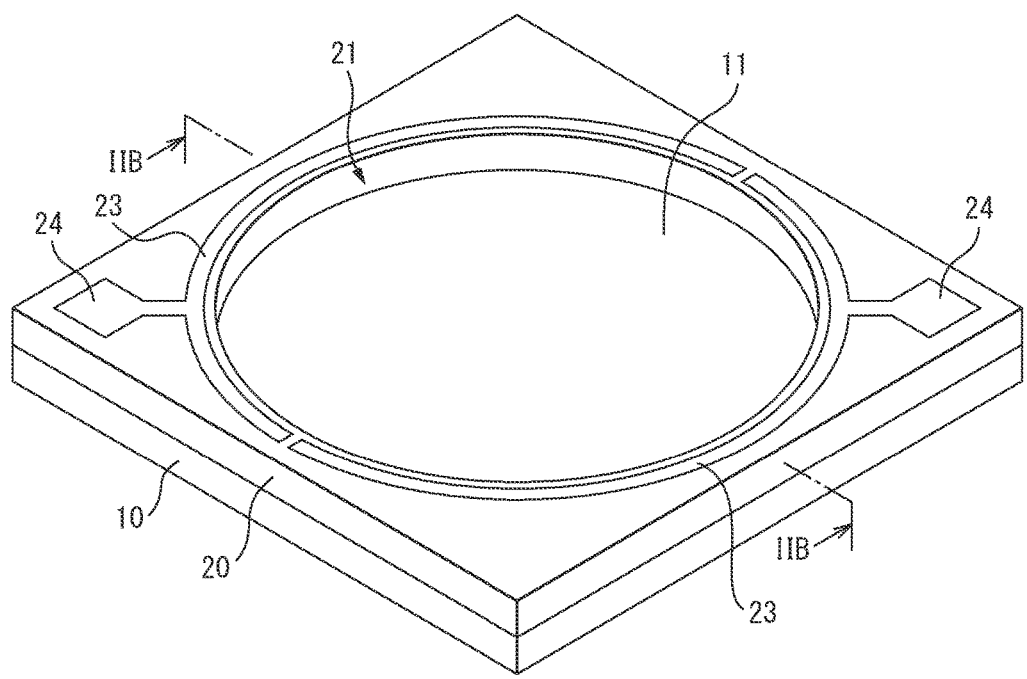
FIG. 2A is a perspective view illustrating a manufacturing process of the light-emitting device 1.
Figure 2B:
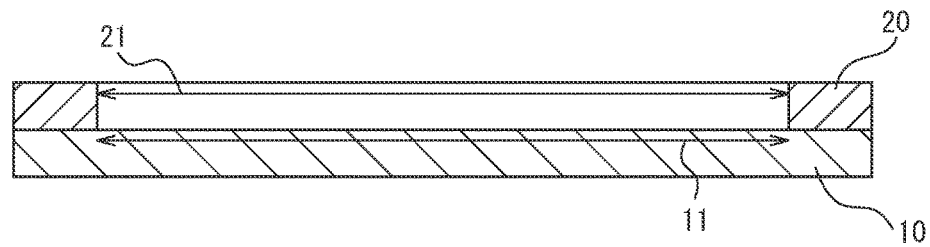
FIG. 2B is a cross-sectional view illustrating a manufacturing process of the light-emitting device 1.
Figure 3A:
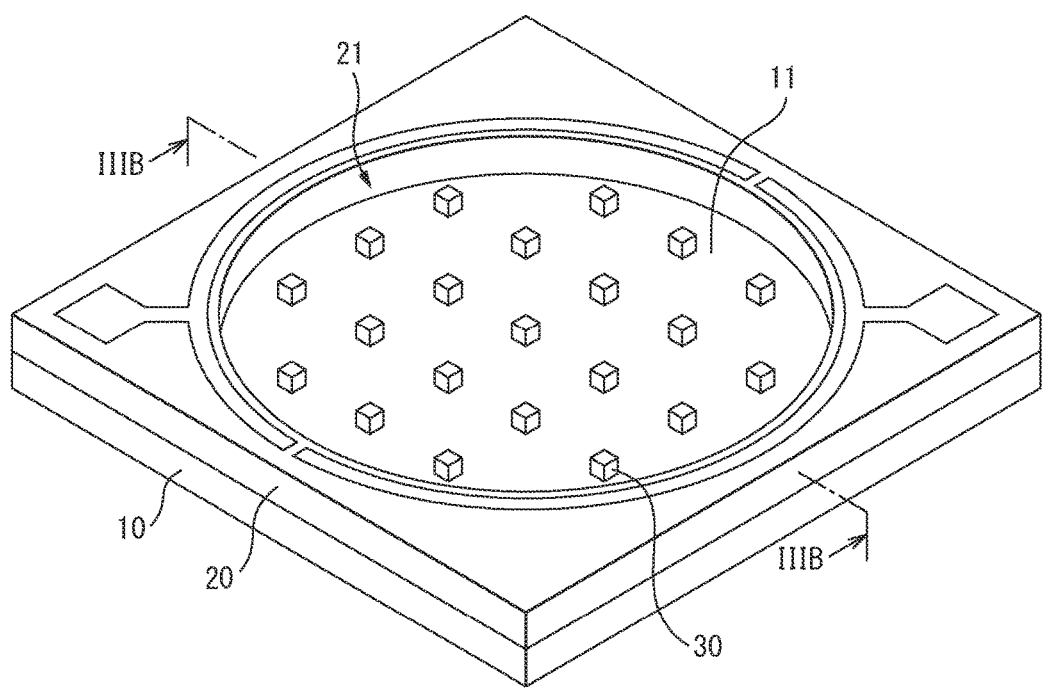
FIG. 3A is a perspective view illustrating a manufacturing process of the light-emitting device 1.
Figure 3B:
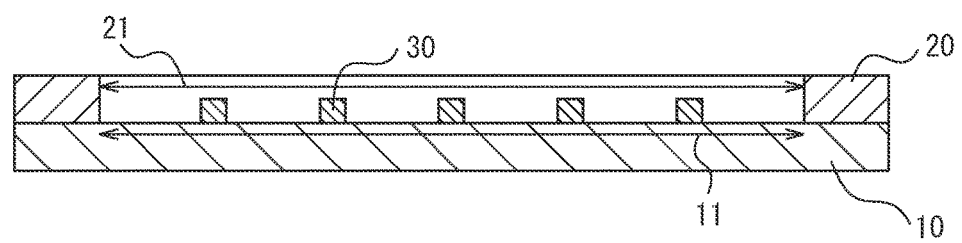
FIG. 3B is a cross-sectional view illustrating a manufacturing process of the light-emitting device 1.
Figure 4A:
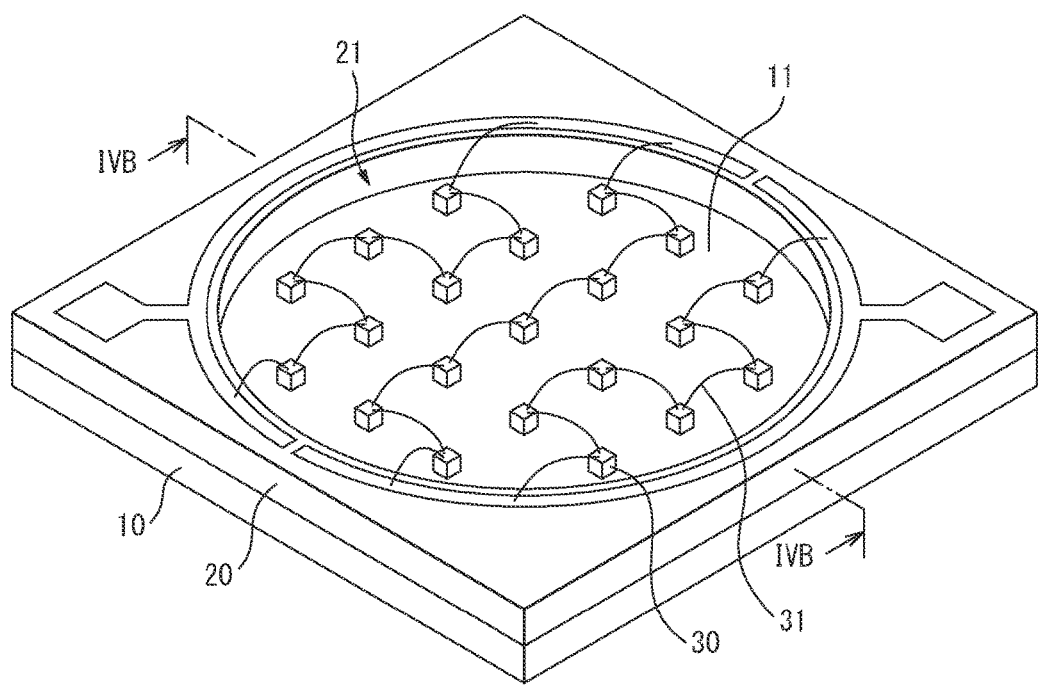
FIG. 4A is a perspective view illustrating a manufacturing process of the light-emitting device 1.
Figure 4B:
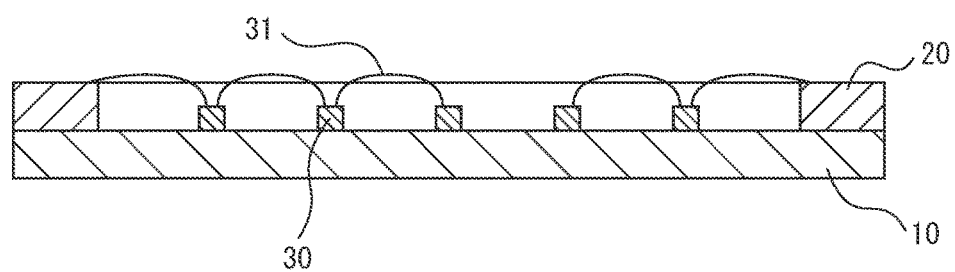
FIG. 4B is a cross-sectional view illustrating a manufacturing process of the light-emitting device 1.

At the time of manufacture of the light-emitting device 1, first, as illustrated in FIG. 2A and FIG. 2B, the mounting substrate 10 and the circuit substrate 20 having the opening 21 are overlapped and attached to each other. Then, as illustrated in FIG. 3A and FIG. 3B, the LED elements 30 are mounted on the mounting region 11 of the mounting substrate 10, which is exposed from the opening 21 of the circuit substrate 20. Next, as illustrated in FIG. 4A and FIG. 4B, adjacent LED elements 30 are electrically connected to one another with the wires 31, and the wires 31 from the LED elements 30 on the outer side of the opening 21 are connected to the conductive patterns 23 of the circuit substrate 20.

Figure 5A:
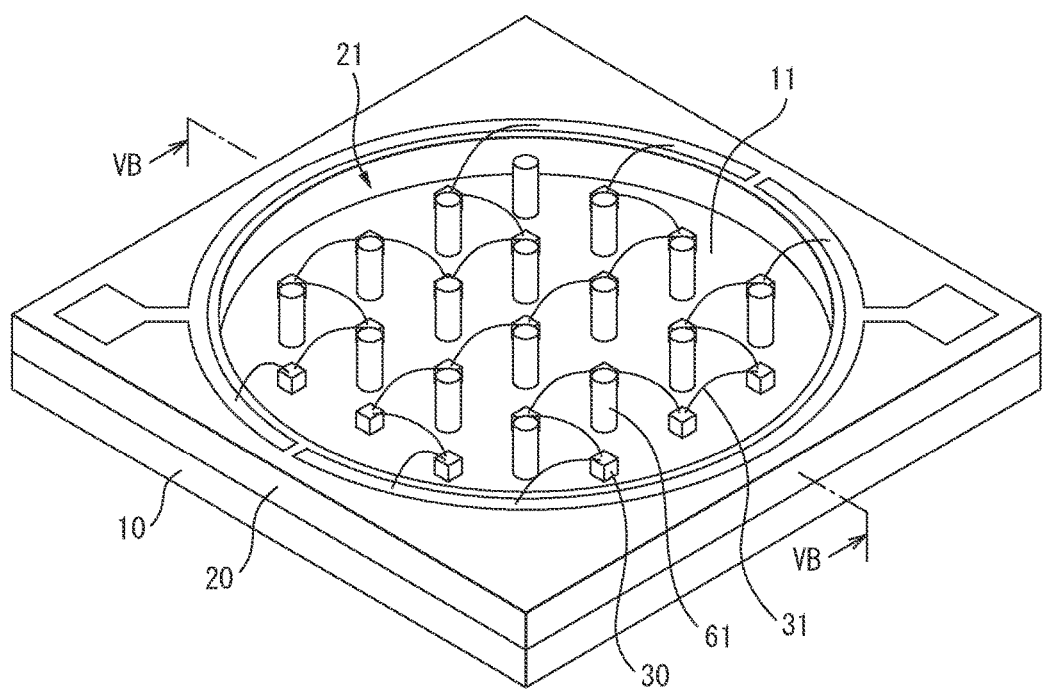
FIG. 5A is a perspective view illustrating a manufacturing process of the light-emitting device 1.
Figure 5B:
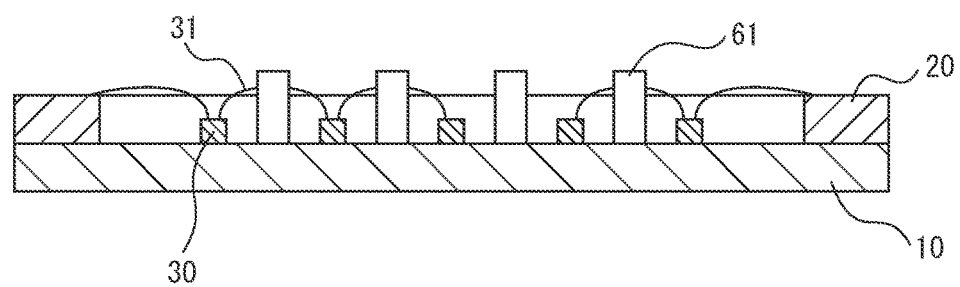
FIG. 5B is a cross-sectional view illustrating a manufacturing process of the light-emitting device 1.
Figure 6A:
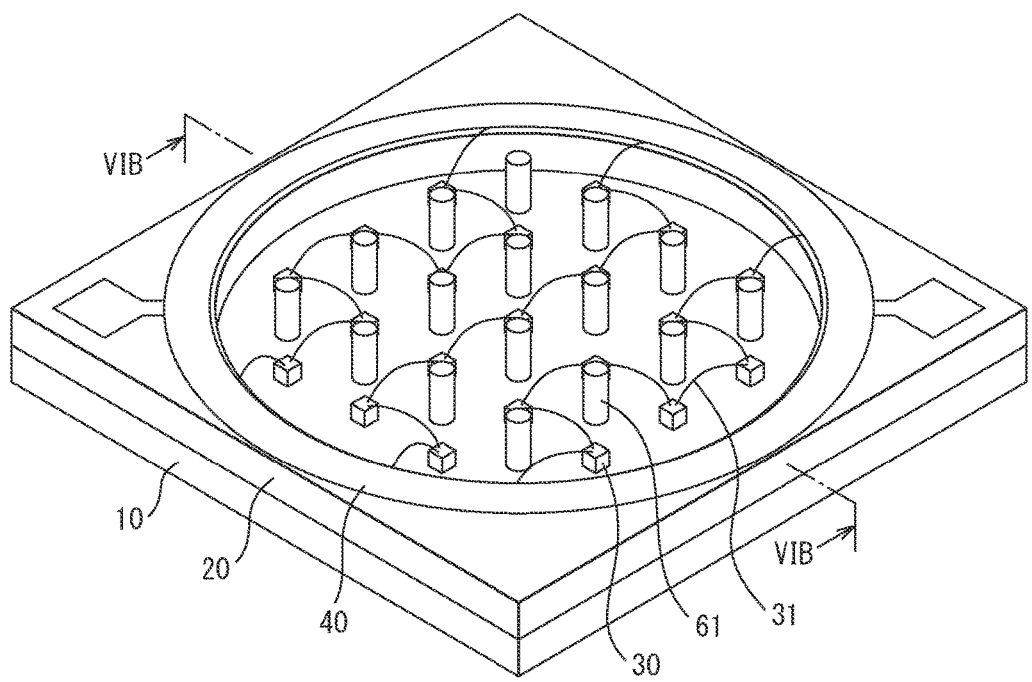
FIG. 6A is a perspective view illustrating a manufacturing process of the light-emitting device 1.
Figure 6B:
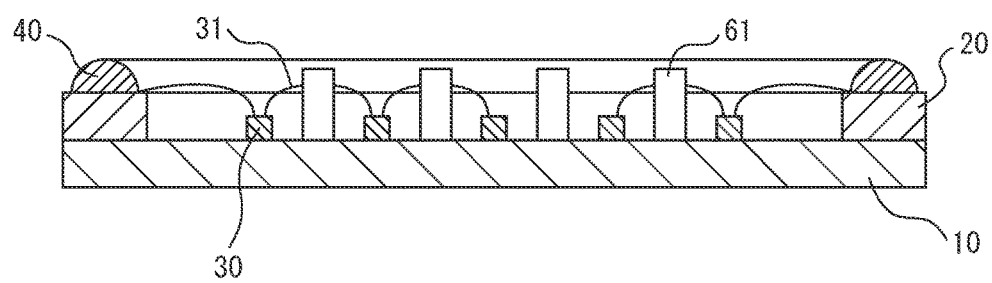
FIG. 6B is a cross-sectional view illustrating a manufacturing process of the light-emitting device 1.
Figure 7A:
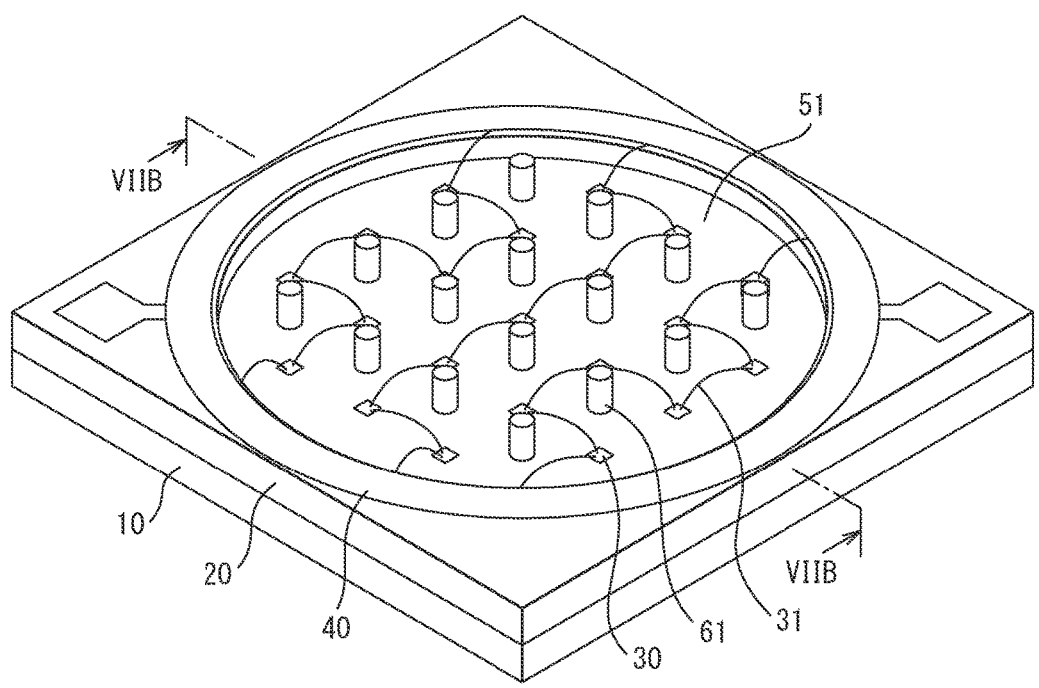
FIG. 7A is a perspective view illustrating a manufacturing process of the light-emitting device 1.
Figure 7B:
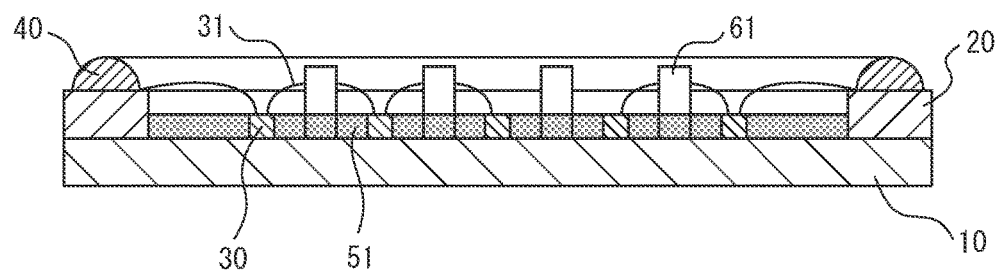
FIG. 7B is a cross-sectional view illustrating a manufacturing process of the light-emitting device 1.

Subsequently, as illustrated in FIG. 5A and FIG. 5B, in the mounting region 11, each of the columnar heat transfer members 61 is bonded to the center of a rectangle formed by four adjacent LED elements 30. Furthermore, as illustrated in FIG. 6A and FIG. 6B, the resin frame 40 is fixed to the conductive patterns 23 of the circuit substrate 20. Then, as illustrated in FIG. 7A and FIG. 7B, a silicone resin or the like containing a phosphor at a relatively high concentration is filled in the opening 21 to form the first layer 51 of the sealing resin 50. After the first layer 51 is hardened, a silicone resin or the like containing a phosphor at a relatively low concentration is further filled in the opening 21 to form the second layer 52 of the sealing resin 50, so that the light-emitting device 1 illustrated in FIG. 1A and FIG. 1B is completed.

The sealing resin 50 containing a phosphor may be filled up to the upper end of the resin frame 40 at one time instead of filling the sealing resin 50 in two stages in which the concentrations of the phosphor are different from each other. In this case, the phosphor particles are made to be precipitated by their own weight while keeping the environmental temperature to be a temperature by which the sealing resin 50 is not hardened, and then, the sealing resin 50 is hardened, so that the first layer 51 and the second layer 52 are formed.

FIG. 8A to FIG. 8E are cross-sectional views of light-emitting devices 2 to 6, respectively. In these drawings, longitudinal sections of the light-emitting devices 2 to 6 are illustrated like FIG. 1B. The light-emitting devices 2 to 6 are different from the light-emitting device 1 only in the shapes of heat transfer members, and other members of the light-emitting devices 2 to 6 are the same as those of the light-emitting device 1. Thus, the light-emitting devices 2 to 6 will be described below with a focus on the heat transfer members thereof. The same reference numerals as those of the light-emitting device 1 are used for parts corresponding to those of the light-emitting device 1, and the detailed description thereof is omitted.

Figure 8A:
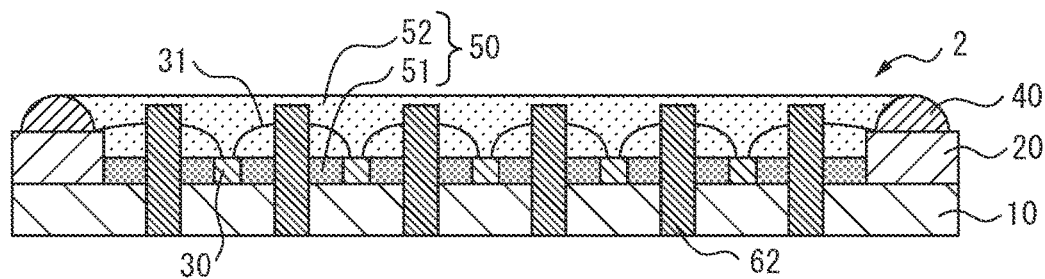
FIG. 8A is a cross-sectional view of light-emitting device 2.
Figure 8B:
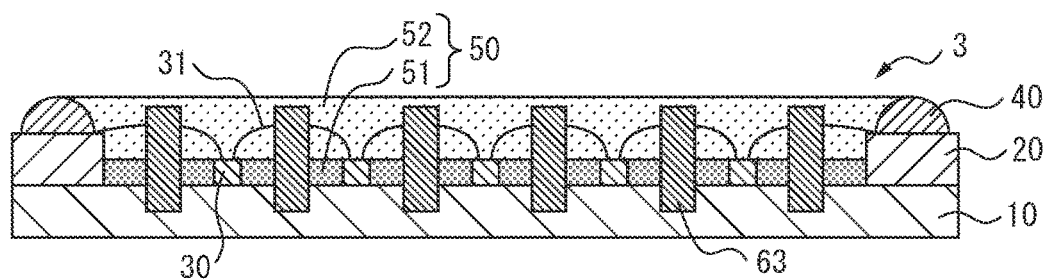
FIG. 8B is a cross-sectional view of light-emitting device 3.

The light-emitting device 2 illustrated in FIG. 8A includes columnar heat transfer members 62 inserted so as to penetrate from the upper surface to the bottom surface of the mounting substrate 10 in the mounting region 11. In addition, the light-emitting device 3 illustrated in FIG. 8B includes columnar heat transfer members 63 inserted from the upper surface to the middle in the thickness direction of the mounting substrate 10 in the mounting region 11. Although the heat transfer members 61 of the light-emitting device 1 are bonded to the upper surface of the mounting substrate 10, the lower ends of the heat transfer members may be embedded in the mounting substrate 10 as in the heat transfer members 62, 63. By embedding the lower ends of the heat transfer members in the mounting substrate 10, an adhesive agent for bonding the heat transfer members to the mounting substrate 10 is not needed, and moreover, the contact area between the heat transfer members and the mounting substrate 10 becomes large, so that heat is easy to be transferred to the mounting substrate 10 from the heat transfer members. Accordingly, the heat dissipation property is further improved.

Figure 8C:
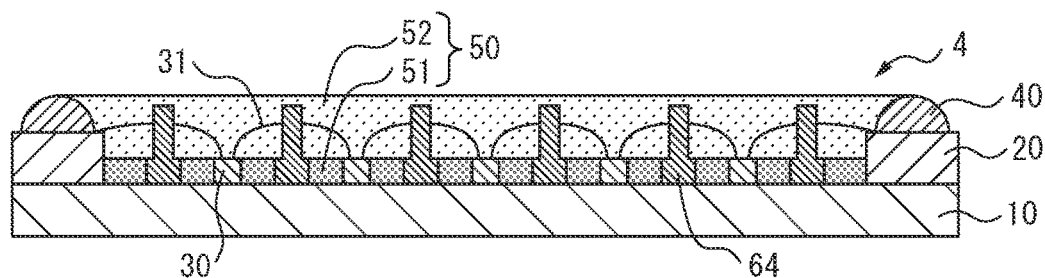
FIG. 8C is a cross-sectional view of light-emitting device 4.

The light-emitting device 4 illustrated in FIG. 8C includes columnar heat transfer members 64 in which steps are formed at the level of the vicinity of the upper end of the first layer 51 and the vicinity of the upper ends of the LED elements 30, and the upper parts are thinner than the lower parts. The columnar heat transfer members are not limited to those having the uniform thickness, and the thickness may become smaller toward the upper ends from the lower ends. The heat transfer members 64 whose upper ends are thin have the advantage that it is more difficult to inhibit passing of light than the heat transfer members 61. In addition, when the light-emitting device 4 is manufactured by filling the sealing resin 50 in two stages in which the concentrations of the phosphor are different from each other, the steps of the heat transfer members 64 are served as a marker of the amount of the sealing resin 50 filled when the first layer 51 containing the phosphor at a relatively high concentration is formed first.

Figure 8D:
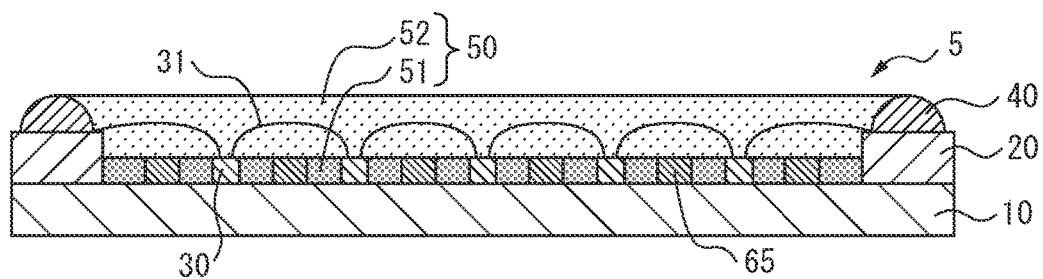
FIG. 8D is a cross-sectional view of light-emitting device 5.

The light-emitting device 5 illustrated in FIG. 8D includes columnar heat transfer members 65 whose height is the vicinity of the upper end of the first layer 51 and the vicinity of the upper ends of the LED elements 30. When the phosphor particles are made to be precipitated in the sealing resin 50, the heat transfer members whose height is relatively low and similar to the first layer 51 containing the phosphor at a relatively high concentration may be provided. In addition, in the case of the columnar members whose height is low in this manner, the mounting substrate 10 and the heat transfer members 65 may be integrally formed by processing a metal substrate. The heat transfer members 65 are located at positions lower than the wires 31, and thus, do not have an effect of protecting the wires 31, but, when the phosphor is concentrated in the first layer 51, have an effect similar to the effect of the heat transfer members 61 to 64 in terms of the heat dissipation property.

Figure 8E:
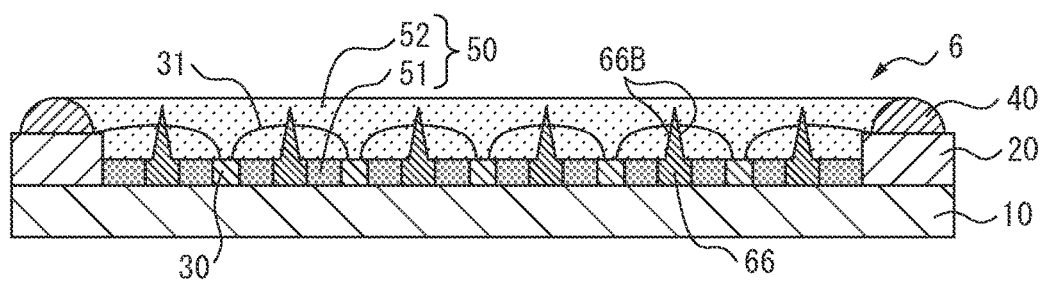
FIG. 8E is a cross-sectional view of light-emitting device 6.

The light-emitting device 6 illustrated in FIG. 8E includes heat transfer members 66 whose upper ends have a pointed shape. The heat transfer members 66 are not the columnar members as exemplified above, and are annular members formed in a concentric fashion in the mounting region 11.

Figure 9A:
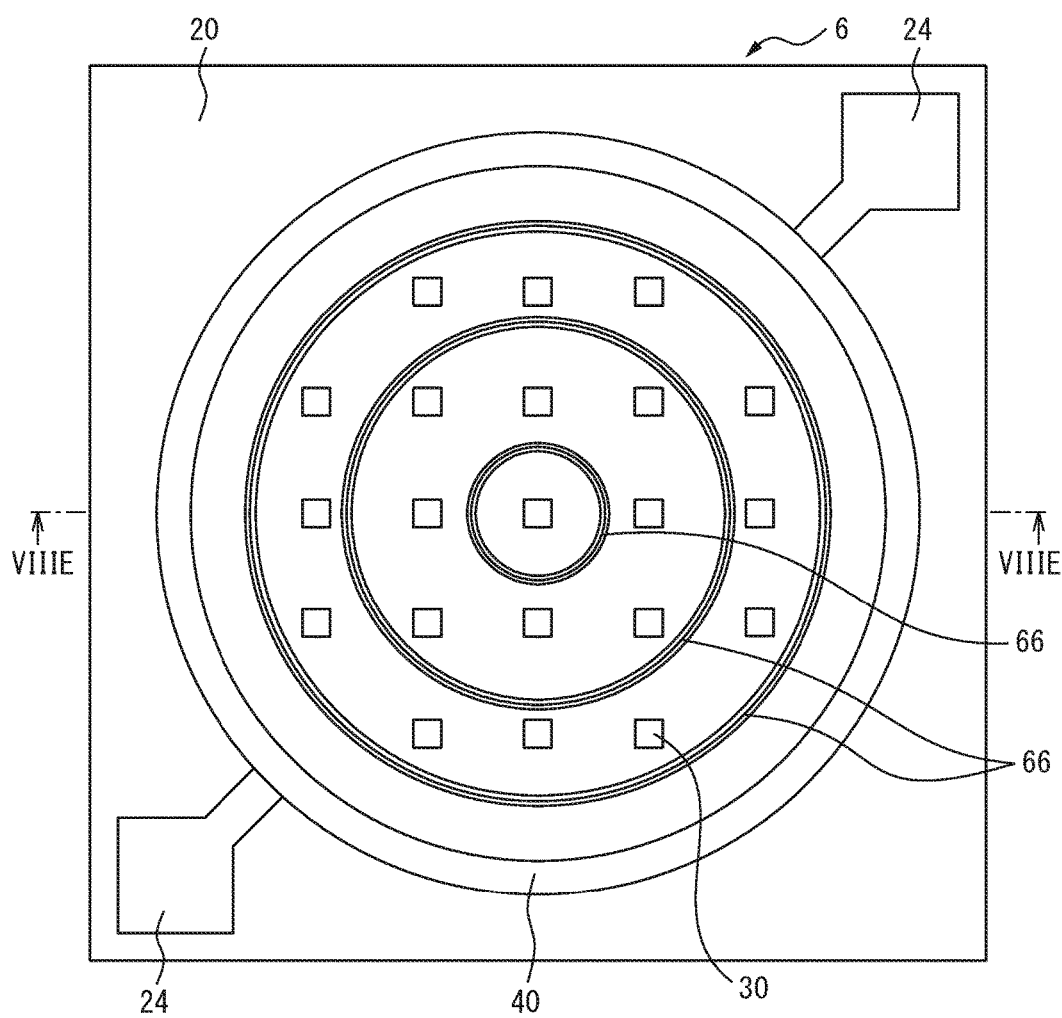
FIG. 9A is a plan view illustrating the arrangement of the LED elements 30 and the heat transfer members 66 of the light-emitting device 6.

FIG. 9A is a plan view illustrating the arrangement of the LED elements 30 and the heat transfer members 66 of the light-emitting device 6. In FIG. 9A, the illustration of the sealing resin 50 is omitted. FIG. 8E corresponds to a cross-section taken along the line VIIIE-VIIIE of FIG. 9A. As illustrated in FIG. 9A, the heat transfer members 65 are members having fence-like circumferential surfaces surrounding the periphery of the LED elements 30, and reflecting surfaces 66B (refer to FIG. 8E) are provided on the circumferential surfaces (side surfaces) thereof by a method of coating with a reflective white resin or the like, for example. The heat transfer members 66 have the inclined side surfaces because of the pointed upper ends, and thus, have a function of reflecting light from the LED elements 30 or the phosphor toward the upper side of the light-emitting device 6 by the side surfaces. Accordingly, in addition to the function of improving the heat dissipation property, the heat transfer members 66 also have a reflector function by which emission light from the light-emitting device 6 is collected toward the upper side, and thus, the emission intensity at the front of the device can be further improved in the light-emitting device 6.

Figure 9B:
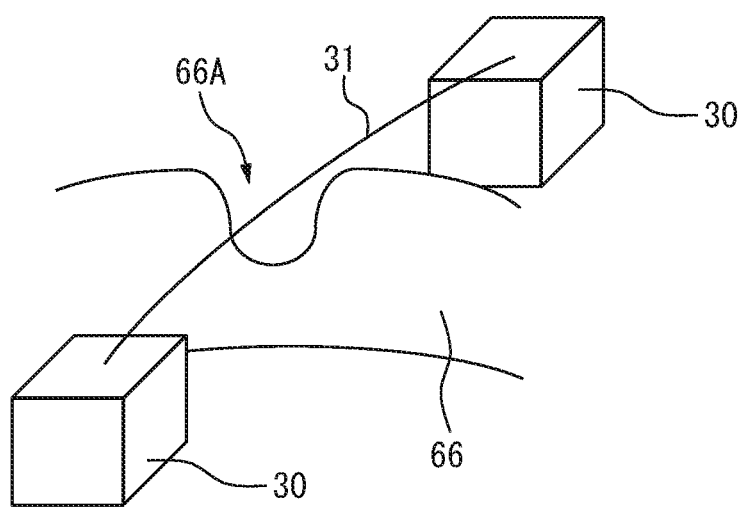
FIG. 9B is a perspective view illustrating a notch 66A provided in the heat transfer members 66.

FIG. 9B is a perspective view illustrating a notch 66A provided in the heat transfer members 66. In FIG. 9B, two LED elements 30 and a part of the heat transfer member 66, which are enlarged, are illustrated. The notch (concave portion) 66A is partially provided on the upper end of the circumferential surface of each heat transfer member 66 so as to make the wire 31 for connecting the two LED elements 30 pass across the heat transfer member 66. Thus, the positions of the upper ends of the heat transfer members 66 are higher than the positions of the wires 31, and thus, even in the light-emitting device 6, the wires 31 are protected by the heat transfer members 66, and cutting thereof can be prevented from occurring.

Figure 10A:
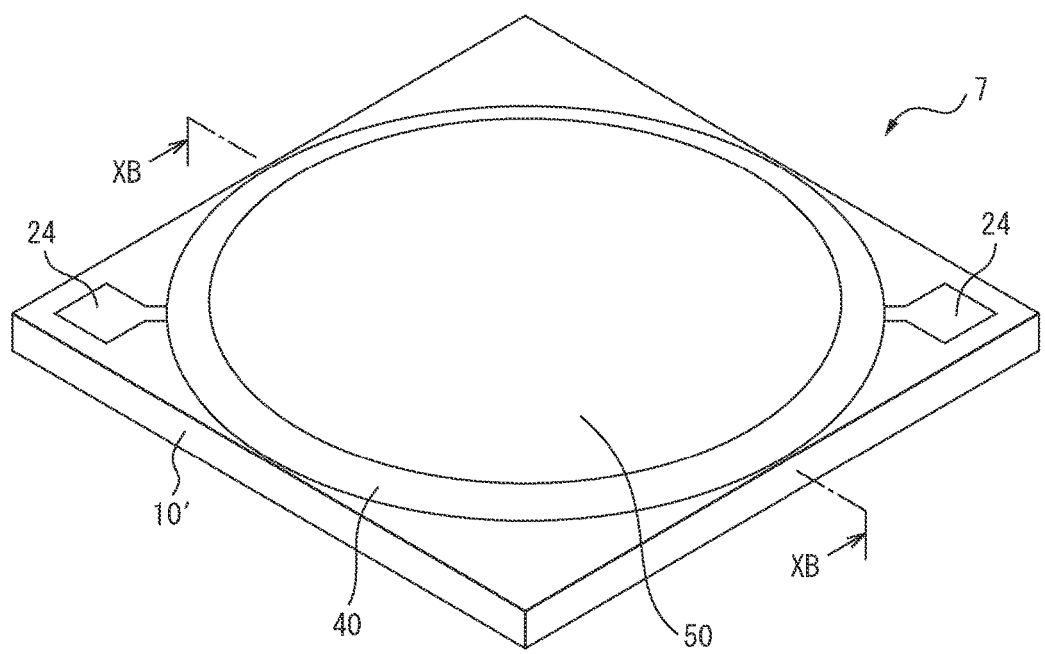
FIG. 10A is a perspective view of a light-emitting device 7.
Figure 10B:
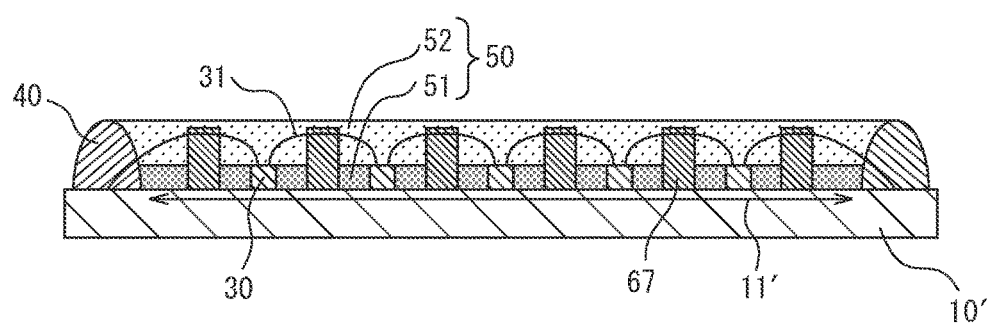
FIG. 10B is a cross-sectional view of the light-emitting device 7.

FIG. 10A is a perspective view of a light-emitting device 7 as a finished product, and FIG. 10B is a cross-sectional view of the light-emitting device 7 taken along the line XB-XB of FIG. 10A. The light-emitting device 7 includes, as main components, a mounting substrate 10', the LED elements 30, the resin frame 40, the sealing resin 50, and heat transfer members 67. The light-emitting device 7 is different from the light-emitting device 1 in that the circuit substrate 20 having the opening 21, which exists in the light-emitting device 1 is absent.

The mounting substrate 10' is an insulating substrate made of ceramic, for example, and has, at the center on the upper surface thereof, a circular mounting region 11' on which the LED elements 30 are mounted. Also in the light-emitting device 7, the LED elements 30, which are the same as those of the light-emitting device 1, are arranged in a lattice pattern, for example, and mounted on the mounting region 11' of the mounting substrate 10'. On the upper surface of the mounting substrate 10', the conductive patterns of the LED elements 30 are formed, and, at two corner parts located at diagonal positions on the upper surface of the mounting substrate 10', the connection electrodes 24 for connecting the light-emitting device 7 to an external power source are formed.

The resin frame 40 is a circular frame (dam material) which is the same as that of the light-emitting device 1, and is made of a white resin, for example, according to the size of the mounting region 11' of the mounting substrate 10'. The sealing resin 50 is injected into a part surrounded by the resin frame 40 on the mounting region 11', and integrally covers and protects (seals) the LED elements 30, the wires 31 that connect the LED elements 30 to one another, and the heat transfer members 67. The sealing resin 50 is a resin having heat resistance, such as a silicone resin, in which a phosphor is dispersedly mixed, like the sealing resin 50 of the light-emitting device 1. In the example illustrated in FIG.

10B, the sealing resin 50 includes the first layer 51 in which the concentration of the phosphor is relatively high and the second layer 52 in which the concentration of the phosphor is relatively low, but the phosphor may be uniformly dispersed in the sealing resin 50.

The heat transfer members 67 are columnar members made of metal (conductive member) which has a higher thermal conductivity and a more excellent heat dissipation property than the sealing resin 50, like the heat transfer members 61. The heat transfer members 67 are arranged among the LED elements 30 in the mounting region 11', and are embedded in the sealing resin 50. As illustrated in FIG. 10B, the lower ends of the heat transfer members 67 are bonded to the upper surface of the mounting substrate 10, and the positions of the upper ends of the heat transfer members 67 are higher than positions where the wires 31 are provided. Also in the light-emitting device 7, by the heat transfer members 67, heat from the phosphor in the sealing resin 50 can be effectively released to the mounting substrate 10', and cutting of the wires 31 when the sealing resin 50 is pressed can be prevented.

Figure 11A:
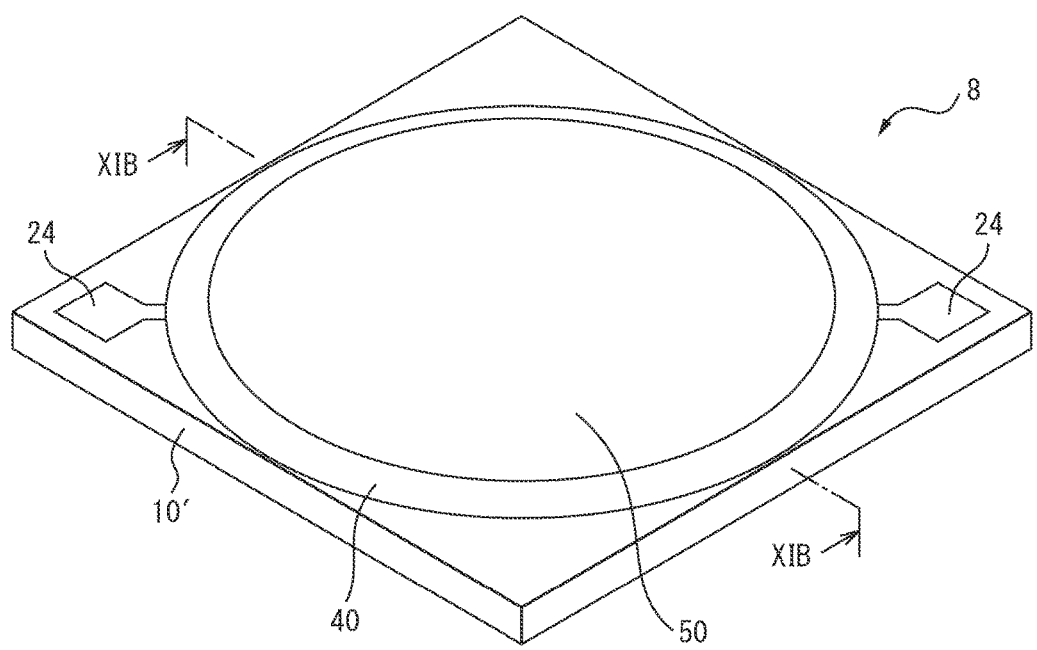
FIG. 11A is a perspective view of a light-emitting device 8.
Figure 11B:
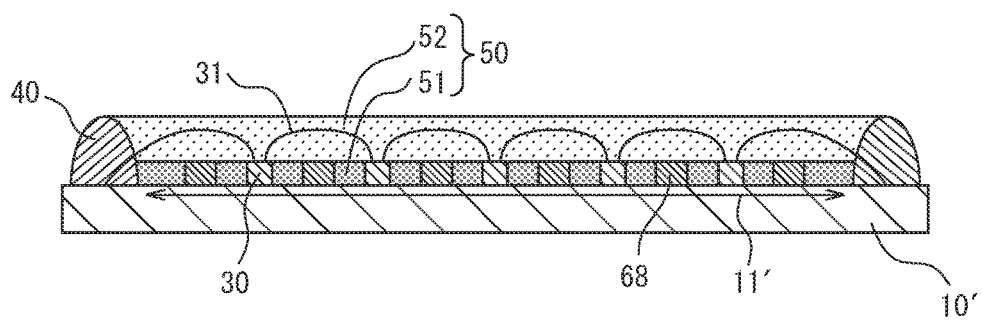
FIG. 11B is a cross-sectional view of the light-emitting device 8.

FIG. 11A is a perspective view of a light-emitting device 8 as a finished product, and FIG. 11B is a cross-sectional view of the light-emitting device 8 taken along the line XIB-XIB of FIG. 11A. The light-emitting device 8 has the same configuration as that of the light-emitting device 7 except for the shape of heat transfer members.

As illustrated in FIG. 11B, heat transfer members 68 of the light-emitting device 8 are columnar heat transfer members which are the same as the heat transfer members 65 of the light-emitting device 5 illustrated in FIG. 8D and have a relatively low height. As just described, even when the mounting substrate 10' is an insulating substrate made of ceramic or the like, the columnar members having a shape different from that of the heat transfer members 67 may be used. In addition, in place of the heat transfer members 68 of the light-emitting device 8, heat transfer members which are the same as any of the heat transfer members 62 to 64, and 66 illustrated in FIG. 8A to FIG. 8C, and FIG. 8E may be used. Even in these cases, the same effect as the light-emitting devices 2 to 6 can be obtained in terms of the heat dissipation property and the protection of the wires 31.

As the heat transfer members, ones having a combination of the features of the shapes of the heat transfer members 61 to 66 may be used. For example, also in the columnar heat transfer members 64 in which the steps are formed and the upper parts are thinner than the lower parts, the columnar heat transfer members 65 whose height is relatively low, and the annular heat transfer members 66 whose upper ends are pointed, the lower ends thereof may be embedded in the mounting substrate 10, 10' in the same manner as the heat transfer members 62, 63.

In addition, in the heat transfer members other than the light-emitting device 5, columnar members having optical transparency may be used so as not to inhibit passing of light. Then, the effect of improving heat dissipation and protecting the wires can be obtained while preventing a decrease in the emission intensity.

In general, as higher the power of the light-emitting devices described above is, the number of mounted light-emitting elements is increased, and a sealing region into which a translucent resin is filled becomes larger, and thus, a sealing resin that fills the sealing region becomes susceptible to external influences.

In addition, when light-emitting devices are attached to various lighting apparatuses and the like, the surface of a sealing resin is sometimes touched by a worker's finger or the like. In general, since the sealing resin is a soft resin, dent deformation is easy to occur in the sealing resin when a human's finger or the like is in contact with the sealing resin. When the dent deformation occurs in the sealing resin, position deviation, breakage, or the like of sealed light-emitting elements may occur. In addition, when the respective light-emitting elements are electrically connected with wires, an electrical defect, such as disconnection, may occur by the wires being compressed due to the dent deformation of the sealing resin or a human's finger or the like contacting the wires.

In view of this, another light-emitting device in which deformation, such as a dent, is difficult to occur in a sealing resin for sealing light-emitting elements mounted on a mounting substrate, and damage is less likely to occur during inspection, attachment to various electrical apparatuses, and the like will be described below.

Figure 12A:
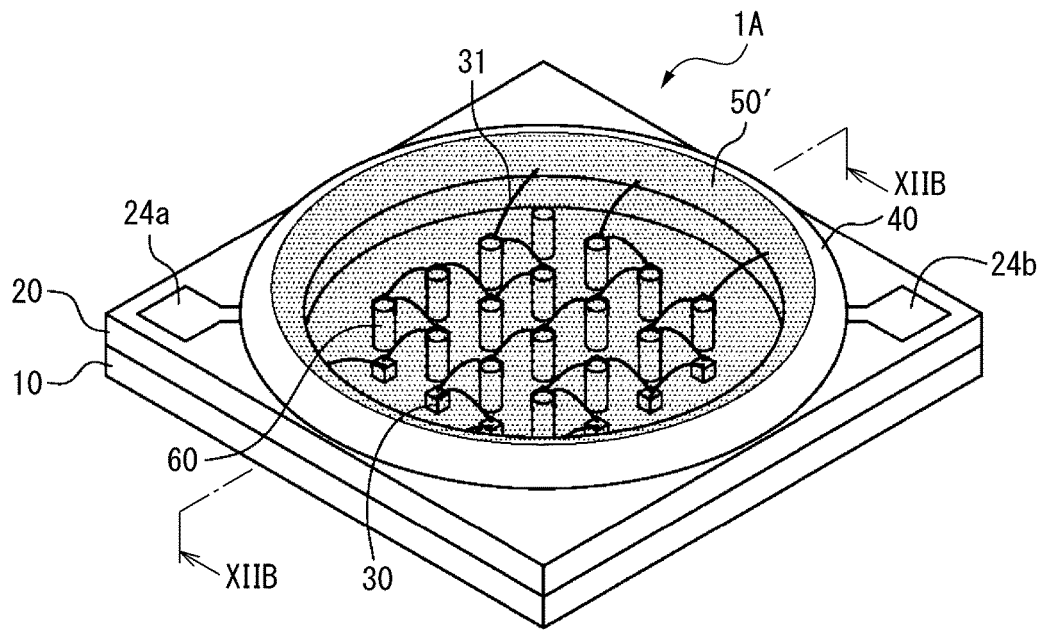
FIG. 12A is a perspective view of a light-emitting device 1A.
Figure 12B:
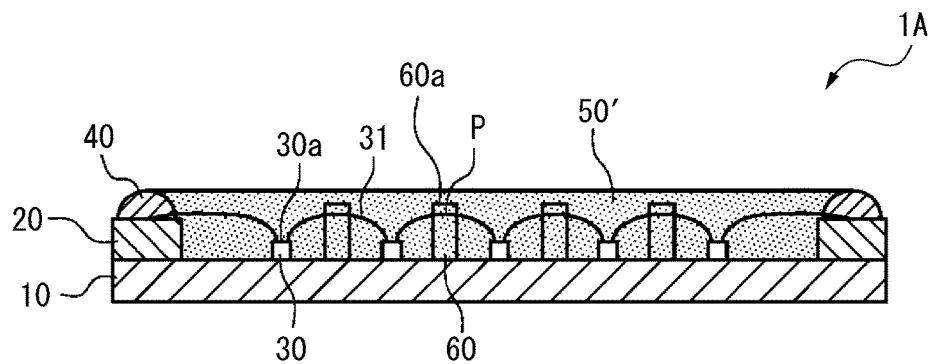
FIG. 12B is a cross-sectional view of the light-emitting device 1A.
Figure 14:
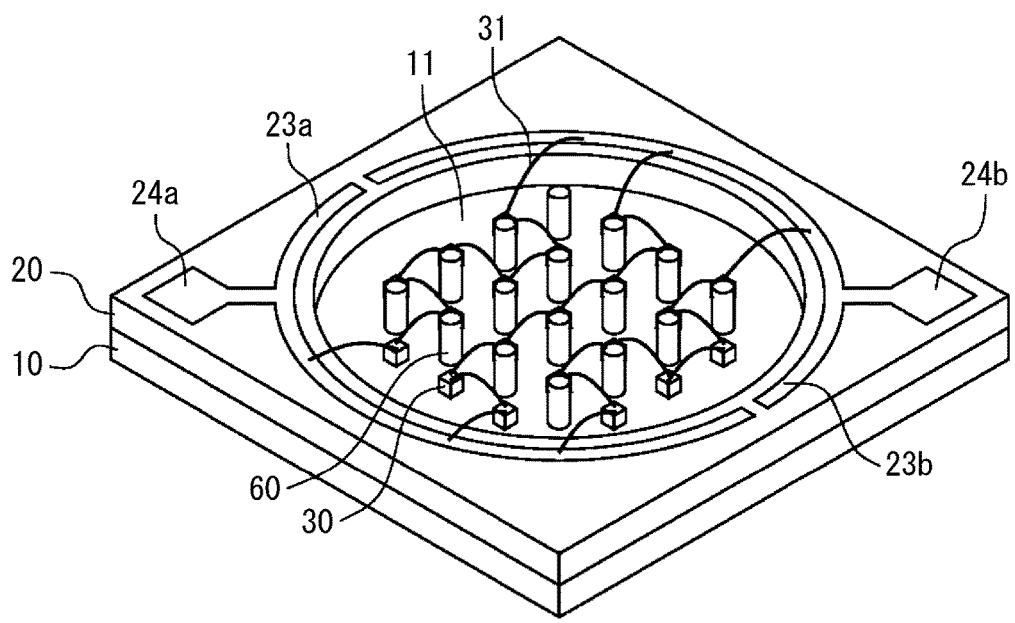
FIG. 14 is a perspective view for describing a manufacturing process of the light-emitting device 1A.
Figure 15:
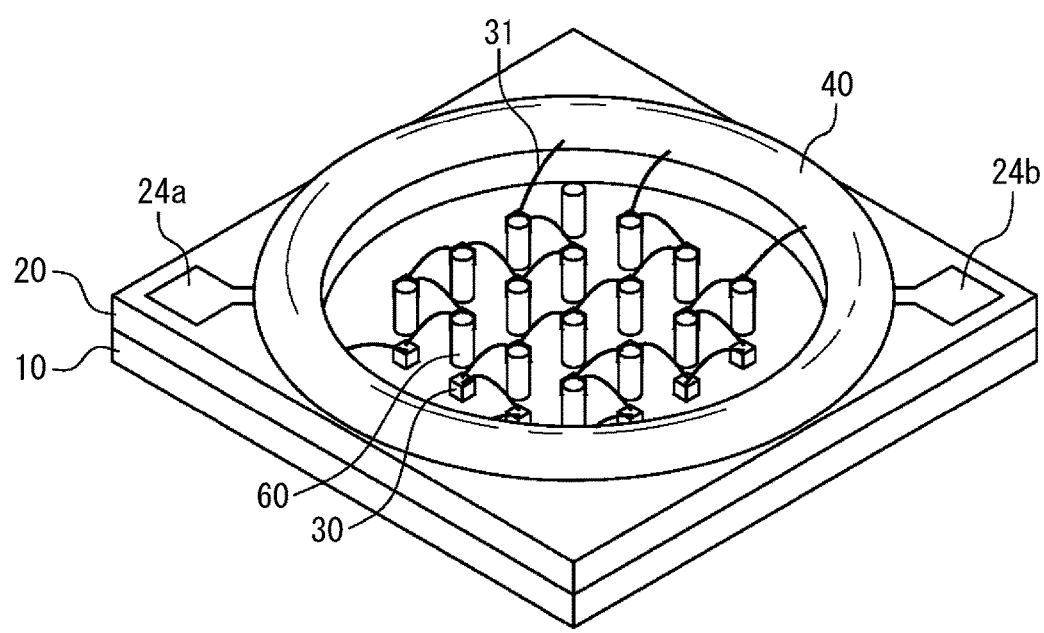
FIG. 15 is a perspective view for describing a manufacturing process of the light-emitting device 1A.

FIG. 12A is a perspective view of a light-emitting device 1A as a finished product, and FIG. 12B is a cross-sectional view of the light-emitting device 1A taken along the line XIIB-XIIB of FIG. 12A. In addition, FIG. 13 to FIG. 15 are perspective views for describing a manufacturing process of the light-emitting device 1A.

The light-emitting device 1A includes, as main components, the mounting substrate 10, the circuit substrate 20, the LED elements 30, the resin frame 40, a sealing resin 50', and deformation preventing members 60. The light-emitting device 1A includes the LED elements as light-emitting elements, is an LED lighting device used as various lighting devices, and emits white light for general lighting, for example. The same reference numerals as those used in the light-emitting device 1 are used for components common to the light-emitting device 1 among components of the light-emitting device 1A.

The mounting substrate 10 is made of a general insulating material, such as an epoxy resin or a BT resin, or metal material having a heat dissipation property. The mounting substrate 10 has the circular mounting region 11 at the center part thereof, and the LED elements 30 are mounted on the mounting region 11. The size of the mounting substrate 10 is, for example, over 10 mm to several tens of mm square, and is determined depending on the needed amount of light emission.

Figure 13:
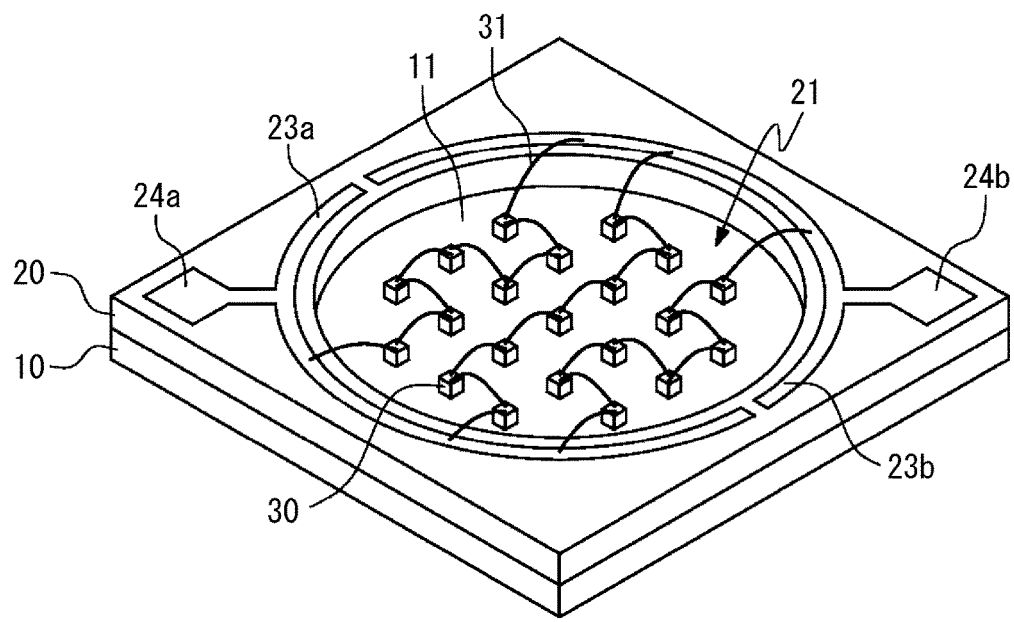
FIG. 13 is a perspective view for describing a manufacturing process of the light-emitting device 1A.

The circuit substrate 20 is an insulating substrate (frame) fixed to the mounting substrate 10, and has the circular opening 21 at the center part thereof, as illustrated in FIG. 13. The region on the mounting substrate 10, which is exposed through the opening 21, corresponds to the mounting region 11. On the upper surface of the circuit substrate 20, a pair of conductive patterns (electrode bands) 23a, 23b is formed along the edge part of the opening 21. In addition, at two corner parts located at diagonal positions on the upper surface of the circuit substrate 20, connection electrodes (electrode terminals) 24a, 24b for connecting the light-emitting device 1A to an external power source are formed. The conductive pattern 23a and the conductive pattern 23b are connected to the connection electrode 24a and the connection electrode 24b, respectively. One of the connection electrodes 24a, 24b is an anode electrode, and the other is a cathode electrode.

The LED elements 30 are blue light-emitting elements (blue LEDs) which are the same type, have the same size, and are made of a gallium nitride compound semiconductor, for example. Each of the blue light-emitting elements is composed of a substrate made of sapphire glass, and a diffusion layer on the substrate, which is obtained by diffusion growth of an n-type semiconductor and a p-type semiconductor. The n-type semiconductor and the p-type semiconductor have an n-type electrode and a p-type electrode on the upper surfaces thereof, respectively. The n-type electrode and the p-type electrode of the LED elements 30 are electrically connected to each other through the wire 31. The LED elements 30 of the light-emitting device 1A are composed of groups connected in parallel to one another, and, in each of the groups, the LED elements 30 are connected in series to one another. The LED elements 30 located at both ends of each of the groups are connected to either one of the conductive patterns 23a, 23b by the wires 31, and a certain current is applied to the LED elements 30 of each of the groups through the pair of connection electrodes 24a, 24b.

The resin frame (sealing frame) 40 is a dam material for preventing flow of the sealing resin 50', and is formed by, for example, heaping up an insulating resin material in an annular shape along the conductive patterns 23a, 23b on the circuit substrate 20.

The sealing resin 50' is a resin material filled in the inside of the opening 21 and a region surrounded by the resin frame 40 above the opening 21, and integrally covers and protects (seals) the LED elements 30, the wires 31, and the deformation preventing members 60 described below. The sealing resin 50' is obtained by shaping a transparent resin base material containing a certain amount of fluorescent agent (phosphor). The sealing resin 50' is configured by mixing an appropriate amount of fluorescent agent made of YAG (yttrium aluminum garnet) that is a raw material of phosphor particles, a dye that is a raw material of pigment particles, or the like into a base material made of an epoxy resin or a silicone resin, for example. In the same manner as the above-described sealing resin 50, the sealing resin 50' may also include layers in which the concentrations of the phosphor are different from one another.

The deformation preventing members 60 are columnar members formed by a resin material, a glass material, or a metal material harder than the sealing resin 50', are vertically arranged among the LED elements 30 on the mounting region 11, and are embedded in the sealing resin 50'. As described below using FIG. 17, the deformation preventing members 60 prevent (suppress) deformation of the sealing resin 50' when the sealing resin 50' is pressed from above.

The manufacturing process of the light-emitting device 1A will be described using FIG. 13 to FIG. 15. At the time of manufacture of the light-emitting device 1A, first, as illustrated in FIG. 13, the LED elements 30 are mounted on the mounting region 11 of the mounting substrate 10 to which the circuit substrate 20 is attached, and adjacent LED elements 30 are electrically connected to one another with the wires 31. The wires 31 from the LED elements 30 on the outer side of the mounting region 11 are connected to the conductive pattern 23a or the conductive pattern 23b of the circuit substrate 20. Subsequently, as illustrated in FIG. 14, in the mounting region 11, the deformation preventing members 60 are bonded among the LED elements 30 at certain intervals. Next, as illustrated in FIG. 15, the resin frame 40 is formed along the conductive patterns 23a, 23b of the circuit substrate 20. The resin frame 40 is formed such that the position of the upper end thereof is higher than the upper ends of the deformation preventing members 60. Then, a silicone resin or the like containing a phosphor is filled in the opening 21 to form the sealing resin 50'. According to the above process, the light-emitting device 1A illustrated in FIG. 12A and FIG. 12B is completed.

As illustrated in FIG. 12B, the upper ends (upper surfaces 60a) of the deformation preventing members 60 are located at positions higher than an upper surface 30a of each of the LED elements 30 and higher than the upper ends of the wires 31 that connect the LED elements 30 to one another. Each of the wires 31 is bridged between adjacent LED elements 30 in a mountain form, and a substantially middle point thereof is the highest position, and thus, the height of the deformation preventing members 60 is determined so as to be higher than this maximum bridging point P. Since the bridging mode of the wires 31 is different depending on a distance between adjacent LED elements 30, the type of the wires 31, a manufacturing environment during bonding, pressing force applied to the sealing resin 50' from the outside, and the like, it is preferable that the height of the deformation preventing members 60 be a height having some room compared to the maximum bridging point P.

As the material of the deformation preventing members 60, for example, a resin material, a glass material, or the like having translucency and light diffusivity is used, and, as the resin material, for example, a silicone resin, an epoxy resin, or the like having higher hardness than the silicone resin configuring the sealing resin 50' is used. In addition, when the deformation preventing members 60 are formed by a metal material, aluminum, copper to whose surface reflection processing for improving reflectivity is applied, or the like is suitable. In particular, when the deformation preventing members 60 are made of a material having a higher thermal conductivity than the sealing resin 50', such as aluminum, copper, or glass, the deformation preventing members 60 also function as heat transfer members.

Figure 16:
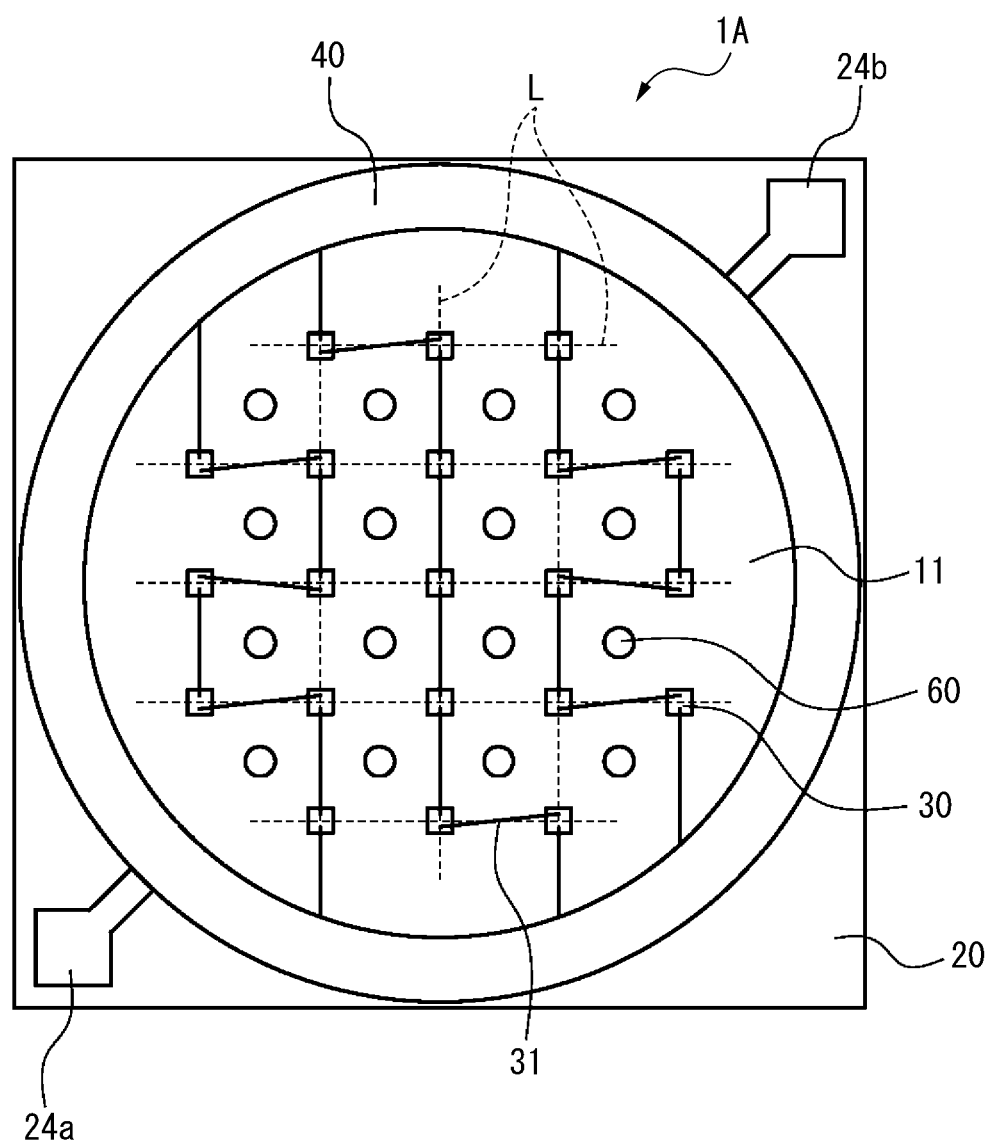
FIG. 16 is a plan view illustrating the arrangement of the LED elements 30 and the deformation preventing members 60 of the light-emitting device 1A.

FIG. 16 is a plan view illustrating the arrangement of the LED elements 30 and the deformation preventing members 60 of the light-emitting device 1A. As indicated by the dashed lines L in FIG. 16, the LED elements 30 are arranged in a lattice pattern on the mounting region 11, and the deformation preventing members 60 are uniformly arranged in respective lattices configured by the LED elements 30. In other words, as viewed from each of the LED elements 30, the deformation preventing members 60 are arranged at four spots in diagonal directions of the lattices configured by the LED elements 30 except for the outer part of the mounting region 11. Thus, each of the LED elements 30 is surrounded by the deformation preventing members 60, or the deformation preventing members 60 and the resin frame 40, on the diagonal lines.

Figure 17:
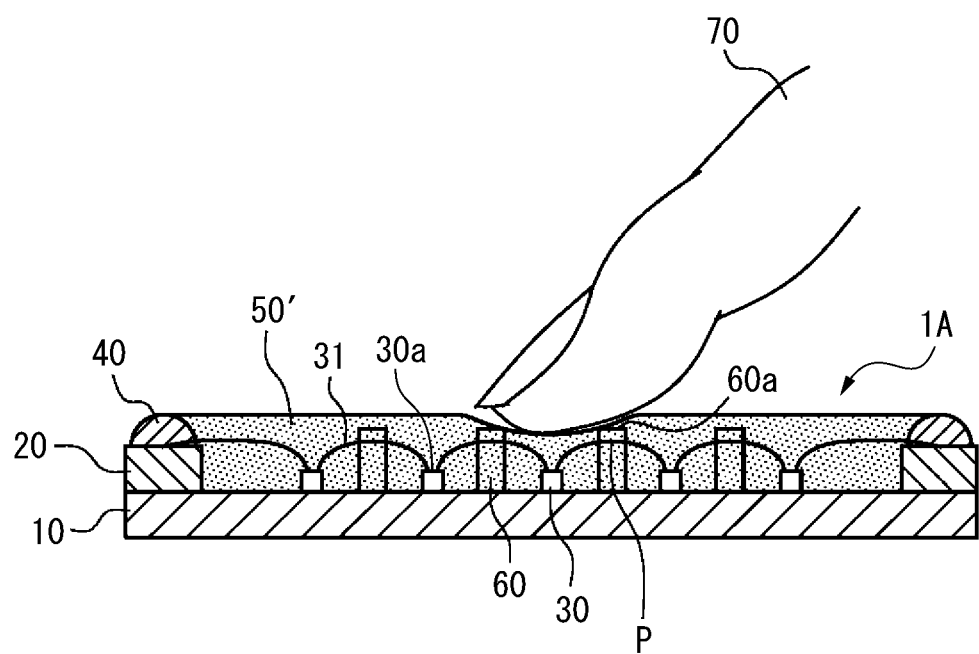
FIG. 17 is a cross-sectional view illustrating the operation and effect of the deformation preventing members 60 in the light-emitting device 1A.

FIG. 17 is a cross-sectional view illustrating the operation and effect of the deformation preventing members 60 in the light-emitting device 1A. The drawing illustrates an example of the case where a protruding object 70 that is a worker's finger is in contact with the sealing resin 50' when the light-emitting device 1A is attached to an electronic device or the like.

As described above, the deformation preventing members 60 are harder than the sealing resin 50', and the upper surfaces 60a of the deformation preventing members 60 are located at positions higher than the upper surface 30a of each of the LED elements 30 and higher than the maximum bridging point P of the wires 31 in the sealing resin 50'. In addition, in the illustrated example, the deformation preventing members 60 are arranged at intervals narrower than a width of the protruding object 70. Thus, even when the protruding object 70 is in contact with the surface of the sealing resin 50' or is pushed to the sealing resin 50' to generate dent deformation, the deformation is prevented by the presence of the deformation preventing members 60 at a depth not in contact with the wires 31. Therefore, even when pressing force is applied to the surface of the sealing resin 50' from the outside, the sealing resin 50' is prevented from being dented to a certain depth or more. Accordingly, the likelihood that the LED elements 30 and the wires 31 are directly affected by external pressure is decreased, and thus, handling during work of assembling and attaching the light-emitting device 1A or the like is easy, and the incidence of breakage during manufacturing and shipping the light-emitting device 1A is decreased. In addition, the LED elements 30 and the wires 31 are difficult to receive a shock from the outside, and thus, the durability is increased, and stable light emission can be maintained for a long time.

The number and the size (thickness) of the arranged deformation preventing members 60 are determined depending on the size of the mounting region 11 and the arrangement intervals of the respective LED elements 30. When the deformation preventing members 60 are provided at least at the center part of the mounting region 11, the amount of dent of the sealing resin 50' can be suppressed to some extent. However, it is preferable that the deformation preventing members 60 be arranged on the whole of the mounting region 11 in a well-balanced way because, even when pressing force is applied to any part of the sealing resin 50', the deformation of the sealing resin 50' is suppressed, and the sealed LED elements 30 and wires 31 can be surely protected.

When the deformation preventing members 60 are formed by a resin material or a glass material, the same fluorescent agent as that contained in the sealing resin 50' and a scattering agent may be contained in the deformation preventing members 60. In this case, the concentrations of the fluorescent agent and the scattering agent contained in the deformation preventing members 60 may be the same degree as the concentration in the sealing resin 50'. Then, uniform light emission without unevenness is obtained, a decrease in light quantity and luminance due to providing of the deformation preventing members 60 is prevented, and a light scattering effect can also be obtained.

The deformation preventing members 60 of the light-emitting device 1A have a circular cylindrical shape, but may have other shapes, such as a rectangular cylindrical shape. Alternatively, the deformation preventing members may be formed into not a cylindrical shape but a wall shape that extends to divide the LED elements 30.

Figure 18A:
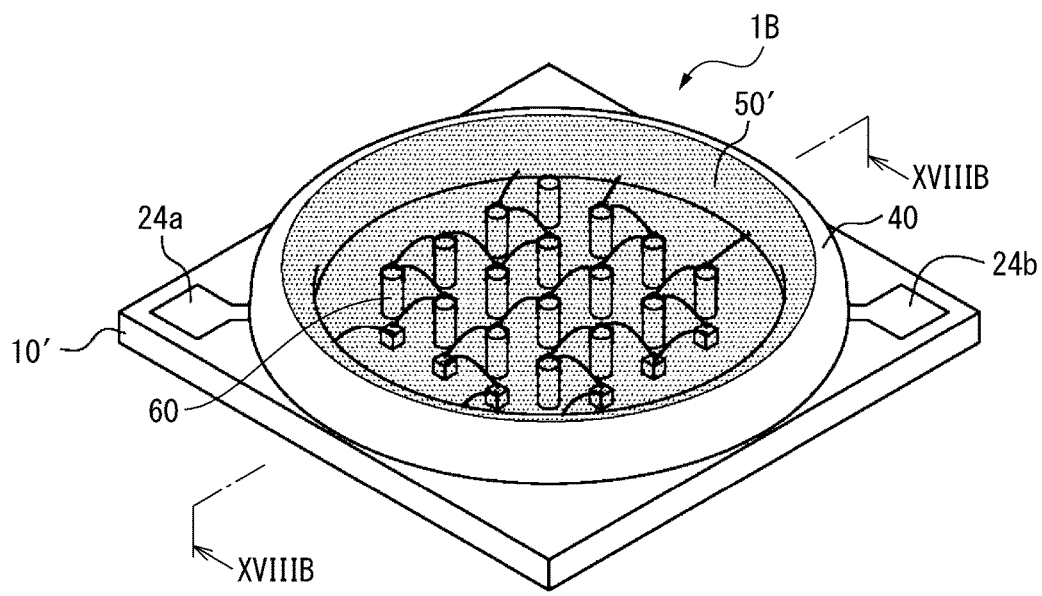
FIG. 18A is a perspective view of a light-emitting device 1B.
Figure 18B:
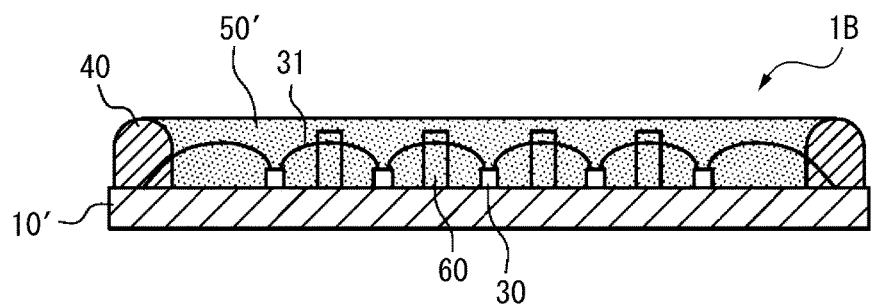
FIG. 18B is a cross-sectional view of the light-emitting device 1B.
Figure 19:
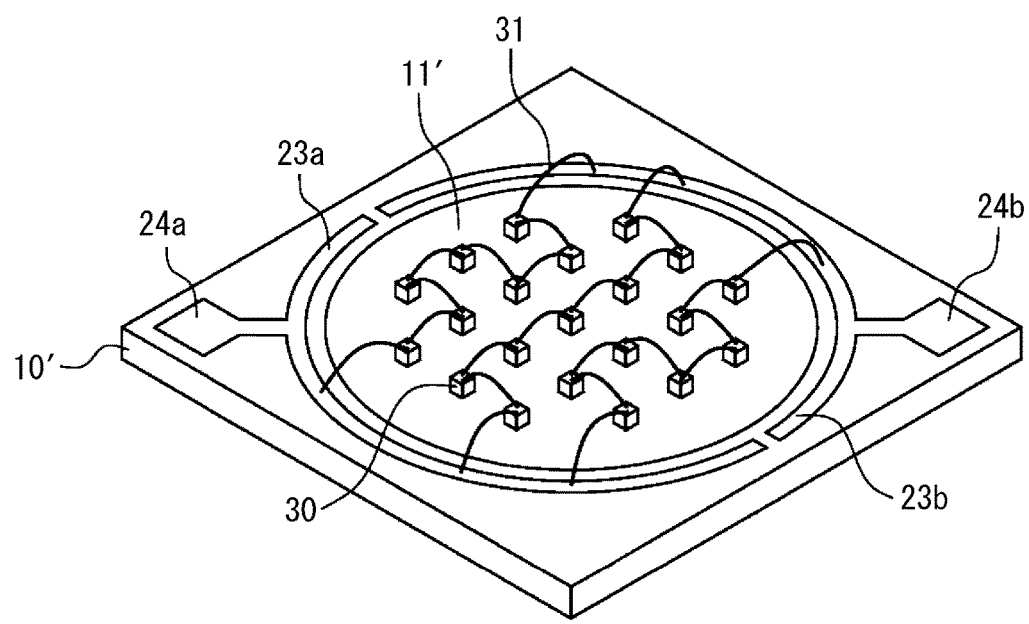
FIG. 19 is a perspective view for describing a manufacturing process of the light-emitting device 1B.
Figure 20:
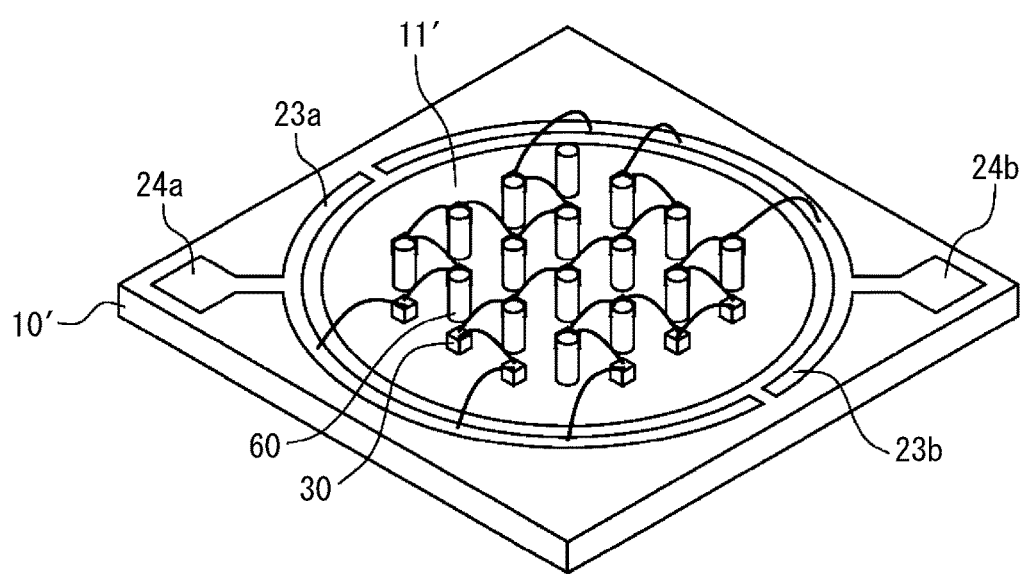
FIG. 20 is a perspective view for describing a manufacturing process of the light-emitting device 1B.
Figure 21:
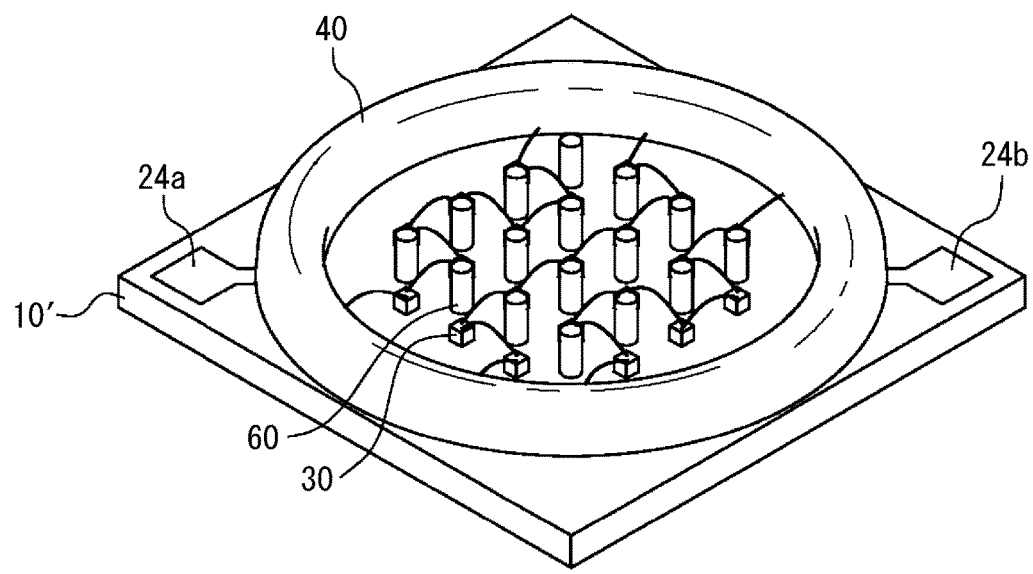
FIG. 21 is a perspective view for describing a manufacturing process of the light-emitting device 1B.

FIG. 18A is a perspective view of a light-emitting device 1B as a finished product, and FIG. 18B is a cross-sectional view of the light-emitting device 1B taken along the line XVIIIB-XVIIIB of FIG. 18A. In addition, FIG. 19 to FIG. 21 are perspective views for describing a manufacturing process of the light-emitting device 1B.

The light-emitting device 1B is different from the light-emitting device 1A in that the mounting substrate 10 and the circuit substrate 20 of the light-emitting device 1A are replaced by the mounting substrate 10', but has the same configurations as the light-emitting device 1A in other respects. Thus, the same reference numerals as those of the light-emitting device 1A are used for parts corresponding to those of the light-emitting device 1A, and the detailed description thereof is omitted.

In the same manner as the mounting substrate 10, the mounting substrate 10' may be a substrate made of a general insulating material, such as an epoxy resin or a BT resin, or metal material having a heat dissipation property, or may be a substrate made of a ceramic material. As illustrated in FIG. 19, the pair of arc-like conductive patterns (electrode bands) 23a, 23b is formed on the upper surface of the mounting substrate 10'. The circular region surrounded by the conductive patterns 23a, 23b on the mounting substrate 10' corresponds to the mounting region 11', and the LED elements 30 are mounted on the mounting region 11'. When the mounting substrate 10' is a ceramic substrate, the exposed surface as the mounting region 11' may be a surface made of a ceramic material.

In addition, at two corner parts located at diagonal positions on the upper surface of the mounting substrate 10', the connection electrodes (electrode terminals) 24a, 24b for connecting the light-emitting device 1B to an external power source are formed. In the same manner as the light-emitting device 1A, the LED elements 30 of the light-emitting device 1B are composed of groups connected in parallel to one another, and, in each of the groups, the LED elements 30 are connected in series to one another by the wires 31. The LED elements 30 located at both ends of each of the groups are connected to either one of the conductive patterns 23a, 23b by the wires 31, and a certain current is applied to the LED elements 30 of each of the groups through the pair of connection electrodes 24a, 24b.

In the light-emitting device 1B, the resin frame 40 is formed by, for example, heaping up an insulating resin material in an annular shape along the conductive patterns 23a, 23b on the mounting substrate 10', and the sealing resin 50' is filled in the region surrounded by the resin frame 40.

The manufacturing process of the light-emitting device 1B will be described using FIG. 19 to FIG. 21. At the time of manufacture of the light-emitting device 1B, first, as illustrated in FIG. 19, the LED elements 30 are mounted on the mounting region 11' of the mounting substrate 10', and adjacent LED elements 30 are electrically connected to one another with the wires 31. The wires 31 from the LED elements 30 on the outer side of the mounting region 11' are connected to the conductive pattern 23a or the conductive pattern 23b of the mounting substrate 10'. Subsequently, as illustrated in FIG. 20, in the mounting region 11', the deformation preventing members 60 are bonded among the LED elements 30 at certain intervals. The shape and the arrangement of the deformation preventing members 60 of the light-emitting device 1B are the same as those of the light-emitting device 1A. Next, as illustrated in FIG. 21, the resin frame 40 is formed along the conductive patterns 23a, 23b on the mounting substrate 10'. The resin frame 40 is formed such that the position of the upper end thereof is higher than the upper ends of the deformation preventing members 60. Then, a silicone resin or the like containing a phosphor is filled in the region surrounded by the resin frame 40 to form the sealing resin 50'. According to the above process, the light-emitting device 1B illustrated in FIG. 18A and FIG. 18B is completed.

Figure 22:
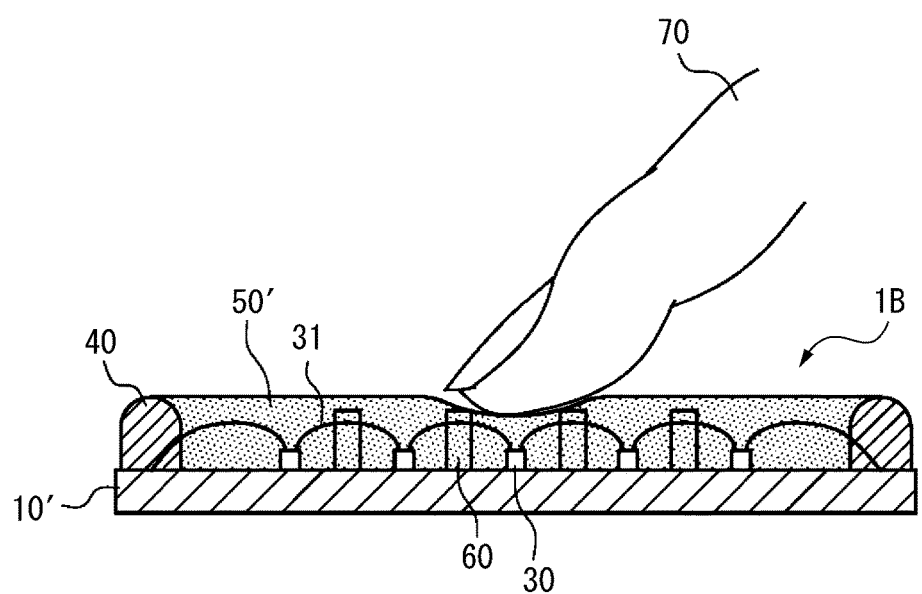
FIG. 22 is a cross-sectional view illustrating the operation and effect of the deformation preventing members 60 in the light-emitting device 1B.

FIG. 22 is a cross-sectional view illustrating the operation and effect of the deformation preventing members 60 in the light-emitting device 1B. In the same manner as the light-emitting device 1A, also in the light-emitting device 1B, even when the protruding object 70, such as a finger, is in contact with the surface of the sealing resin 50' or is pushed to the sealing resin 50', deformation of the sealing resin 50' is prevented by the presence of the deformation preventing members 60. Thus, the likelihood that the sealed LED elements 30 and wires 31 are directly affected by external pressure is decreased, and thus, the incidence of breakage can be decreased. In addition, in the light-emitting device 1B, the external intensity of the sealing resin 50' is decreased compared to the light-emitting device 1A, but the number of parts and the manufacturing cost can be decreased. Since the deformation preventing members 60 made of a material harder than the sealing resin 50' are provided on the mounting region 11' as a core material, the sealing resin 50' has sufficient external intensity even in the light-emitting device 1B.

In addition, also in the light-emitting device 1B, when the deformation preventing members 60 are a translucent resin material, a fluorescent agent and a scattering agent may be contained in the deformation preventing members 60 in the same manner as the light-emitting device 1A. Then, the light diffusivity is improved, and a decrease in light quantity and luminance due to providing of the deformation preventing members 60 is prevented. In addition, when the deformation preventing members 60 are formed by a metal material, dent deformation of the sealing resin 50' due to pressure from the outside is further suppressed compared to the case where the deformation preventing members 60 are formed by a resin material or a glass material, and a light reflecting effect and a light scattering effect can also be obtained. In particular, when the deformation preventing members 60 are made of a material having a higher thermal conductivity than the sealing resin 50', the deformation preventing members 60 also function as heat transfer members.

Figure 23A:
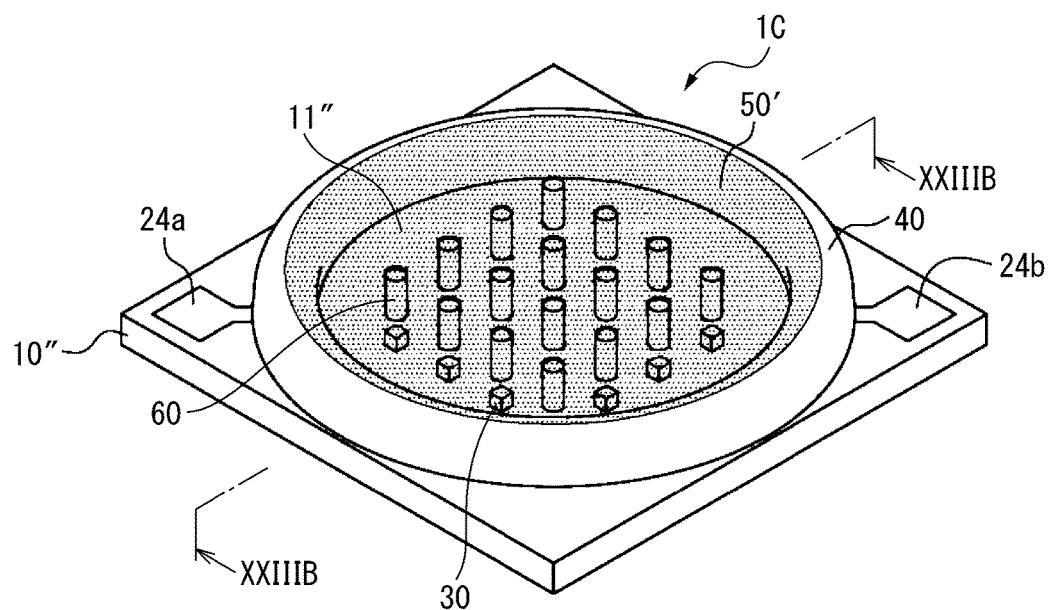
FIG. 23A is a perspective view of a light-emitting device 1C.
Figure 23B:
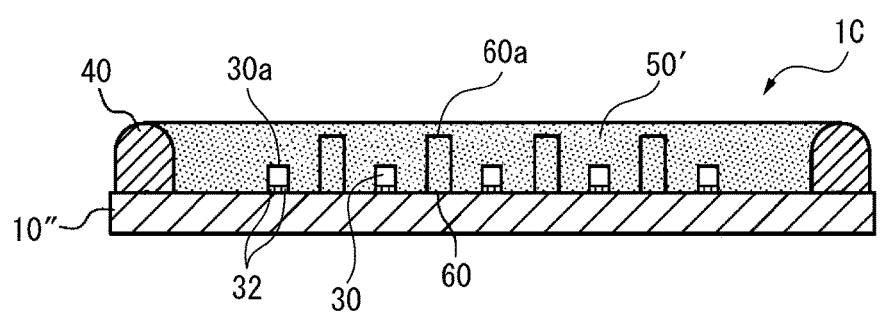
FIG. 23B is a cross-sectional view of the light-emitting device 1C.

FIG. 23A is a perspective view of a light-emitting device 1C as a finished product, and FIG. 23B is a cross-sectional view of the light-emitting device 1C taken along the line XXIIIB-XXIIIB of FIG. 23A. In the light-emitting devices 1A, 1B, the respective LED elements 30 are electrically connected with the wires; however, in the light-emitting device 1C, the respective LED elements 30 are mounted on electrode patterns formed on a mounting region 11" of a mounting substrate 10" through bumps 32. The light-emitting device 1C has the same configurations as the light-emitting device 1B in other respects. The deformation preventing members 60 can be applied to a light-emitting device having surface mount LED elements, such as the light-emitting device 1C.

Also in the light-emitting device 1C, deformation when the sealing resin 50' is pressed is prevented by the deformation preventing members 60, and thus, the incidence of breakage by external pressure is decreased. In a light-emitting device including only surface mount LED elements as light-emitting elements, such as the light-emitting device 1C, there are no wires for wiring the LED elements 30, and thus, the upper ends (upper surfaces 60a) of the deformation preventing members 60 may be located at positions higher than the upper surface 30a of each of the LED elements 30. Thus, in the light-emitting device 1C, the height of the deformation preventing members 60 can be made lower, and the overall height of the sealing resin 50' can be kept lower than the light-emitting devices 1A, 1B.

The invention claimed is:

1. A light-emitting device comprising:
a mounting substrate having flat upper and lower surfaces, the upper surface including a mounting region;
light-emitting elements mounted on the mounting region and arranged in a square lattice pattern on the mounting region;
a sealing resin which contains a phosphor and integrally seals the light-emitting elements;
wires for electrically connecting the light-emitting elements to one another in the sealing resin, the wires being arranged on sides of squares of the square lattice pattern; and
columnar heat transfer members respectively arranged at centers of square areas configured by the wires and the light-emitting elements on the mounting region, the columnar heat transfer members being embedded in the sealing resin, and made of a material having a higher thermal conductivity and higher hardness than the sealing resin, wherein each of the columnar heat transfer members is solid and has a flat upper surface and a lower part in contact with the mounting substrate, and wherein none of the columnar heat transfer members protrudes through the lower surface of the mounting substrate.

2. The light-emitting device according to claim 1, wherein a lower end of the columnar heat transfer members is embedded in the mounting substrate.

3. The light-emitting device according to claim 1, wherein the columnar heat transfer members include an upper end located at a position higher than upper ends of the wires.

4. The light-emitting device according to claim 3, wherein the columnar heat transfer members are made of a metal material.

5. The light-emitting device according to claim 3, wherein a whole of each of the columnar heat transfer members is made of a material having translucency or light diffusivity, and contains a phosphor, and
light from the light-emitting elements passes through the columnar heat transfer members.

6. The light-emitting device according to claim 1, wherein the sealing resin includes a first layer and a second layer in which a concentration of the phosphor is different from each other, in this order from a side near the mounting substrate, and
the concentration of the phosphor in the first layer is higher than the concentration of the phosphor in the second layer.

7. The light-emitting device according to claim 1, further comprising a circuit substrate fixed onto the upper surface of the mounting substrate, the circuit substrate having an opening in which the mounting region is exposed,
wherein the mounting substrate is a metal substrate.

8. The light-emitting device according to claim 2, wherein:
the columnar heat transfer members pass through the mounting substrate, and
lower surfaces of the columnar heat transfer members are flush with the lower surface of the mounting substrate.

9. The light-emitting device according to claim 6, wherein each of the columnar heat transfer members has a first constant diameter in the first layer, and has a second constant diameter smaller than the first constant diameter in the second layer.

* * * * *

UNITED STATES PATENT AND TRADEMARK OFFICE
CERTIFICATE OF CORRECTION

PATENT NO. : 10,361,344 B2  
APPLICATION NO. : 15/534297  
DATED : July 23, 2019  
INVENTOR(S) : Koichi Fukasawa and Nodoka Oyamada Page 1 of 1

It is certified that error appears in the above-identified patent and that said Letters Patent is hereby corrected as shown below:

On the Title Page

(30) Foreign Application Priority Data, delete "Dec. 10, 2015 (JP) 2014-250850" and insert -- Dec. 11, 2014 (JP) 2014-250850 --

Signed and Sealed this  
Twenty-eighth Day of January, 2020

Andrei Iancu  
*Director of the United States Patent and Trademark Office*